(12) United States Patent
Wu et al.

(10) Patent No.: US 10,340,449 B2
(45) Date of Patent: Jul. 2, 2019

(54) RESISTIVE MEMORY DEVICE CONTAINING CARBON BARRIER AND METHOD OF MAKING THEREOF

(71) Applicant: SANDISK TECHNOLOGIES LLC, Plano, TX (US)

(72) Inventors: Ming-Che Wu, San Jose, CA (US); Alvaro Padilla, San Jose, CA (US); Tanmay Kumar, Pleasanton, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/611,029

(22) Filed: Jun. 1, 2017

(65) Prior Publication Data
US 2018/0351093 A1    Dec. 6, 2018

(51) Int. Cl.
*H01L 45/00* (2006.01)
*H01L 27/24* (2006.01)
*G11C 13/00* (2006.01)

(52) U.S. Cl.
CPC ........ *H01L 45/1246* (2013.01); *G11C 13/004* (2013.01); *H01L 27/2463* (2013.01); *H01L 45/085* (2013.01); *H01L 45/1266* (2013.01); *H01L 45/146* (2013.01); *H01L 45/1616* (2013.01); *H01L 45/1641* (2013.01); *G11C 2013/0045* (2013.01)

(58) Field of Classification Search
CPC ............... H01L 45/1246; H01L 45/085; H01L 27/2463; H01L 45/1266; H01L 45/146; H01L 45/1616; H01L 45/1641; G11C 13/004; G11C 2013/0045

USPC .......................................................... 365/148
See application file for complete search history.

(56) References Cited

U.S. PATENT DOCUMENTS

| | | | |
|---|---|---|---|
| 4,845,533 A * | 7/1989 | Pryor | H01L 27/2463 257/4 |
| 5,915,167 A | 6/1999 | Leedy | |
| 6,330,137 B1 * | 12/2001 | Knapp | B82Y 10/00 257/E21.665 |
| 7,800,934 B2 | 9/2010 | Kumar et al. | |
| 8,237,146 B2 | 8/2012 | Kreupl et al. | |
| 9,343,507 B2 | 5/2016 | Takaki | |
| 9,419,125 B1 * | 8/2016 | Schultz | H01L 29/207 |
| 9,437,658 B2 | 9/2016 | Sakotsubo | |
| 9,595,670 B1 * | 3/2017 | Gee | H01L 45/085 |

(Continued)

FOREIGN PATENT DOCUMENTS

WO    WO2007-004843 A1    1/2007

OTHER PUBLICATIONS

Govoreanu, et al., Vacancy-Modulated Conductive Oxide Resistive RAM (VMCO-RRAM): An Area-Scalable Switching Current, Self Compliant, Highly Nonlinear and Wide on/Off-Window Resistive Switching Cell, IEDM13, 2013, pp. 256-259, Leuven-Belgium.

(Continued)

*Primary Examiner* — Sung Il Cho
(74) *Attorney, Agent, or Firm* — The Marbury Law Group, PLLC

(57) ABSTRACT

A resistive memory device, such as a BMC ReRAM device, includes at least one resistive memory element which contains a carbon barrier material portion and a resistive memory material portion that is disposed between a first electrode and a second electrode.

10 Claims, 20 Drawing Sheets

(56) References Cited

U.S. PATENT DOCUMENTS

| | | | |
|---|---|---|---|
| 2009/0303781 A1* | 12/2009 | Lowrey | G11C 5/02 365/163 |
| 2012/0001142 A1 | 1/2012 | Caimi et al. | |
| 2013/0043455 A1 | 2/2013 | Bateman | |
| 2013/0119343 A1* | 5/2013 | Lee | H01L 45/08 257/4 |
| 2013/0214239 A1 | 8/2013 | Caimi et al. | |
| 2014/0117302 A1* | 5/2014 | Goswami | H01L 45/06 257/4 |
| 2014/0306173 A1* | 10/2014 | Huang | H01L 45/1253 257/4 |
| 2015/0021540 A1* | 1/2015 | Xie | H01L 45/146 257/4 |
| 2015/0263069 A1 | 9/2015 | Jo | |
| 2016/0043142 A1* | 2/2016 | Hong | H01L 45/08 257/4 |
| 2016/0043143 A1 | 2/2016 | Sakotsubo | |
| 2016/0351805 A1* | 12/2016 | Lin | H01L 45/1633 |
| 2017/0084818 A1* | 3/2017 | Braganca | G11C 5/145 |
| 2017/0288140 A1* | 10/2017 | Karpov | H01L 45/1233 |

OTHER PUBLICATIONS

S.H. Jo et al., "Cross-Point Resistive RAM Based on Field-Assisted Superlinear Threshold Selector", IEEE Transactions on Electron Devices, vol. 62 No. 11, Nov. 2015, pp. 3477-3481.

L. Zhang, "Study of the Selector Element for Resistive Memory" ), Ku Leuven Arenberg Doctoral School-Faculty of Engineering of Science, Oct. 2015, pp. 232, Haverly-Belgium (4 Parts).

U.S. Appl. No. 15/157,945, filed May 18, 2016, SanDisk Technologies LLC.

U.S. Appl. No. 15/228,216, filed Aug. 4, 2016, SanDisk Technologies LLC.

U.S. Appl. No. 15/581,078, filed Apr. 28, 2017, SanDisk Technologies LLC.

* cited by examiner

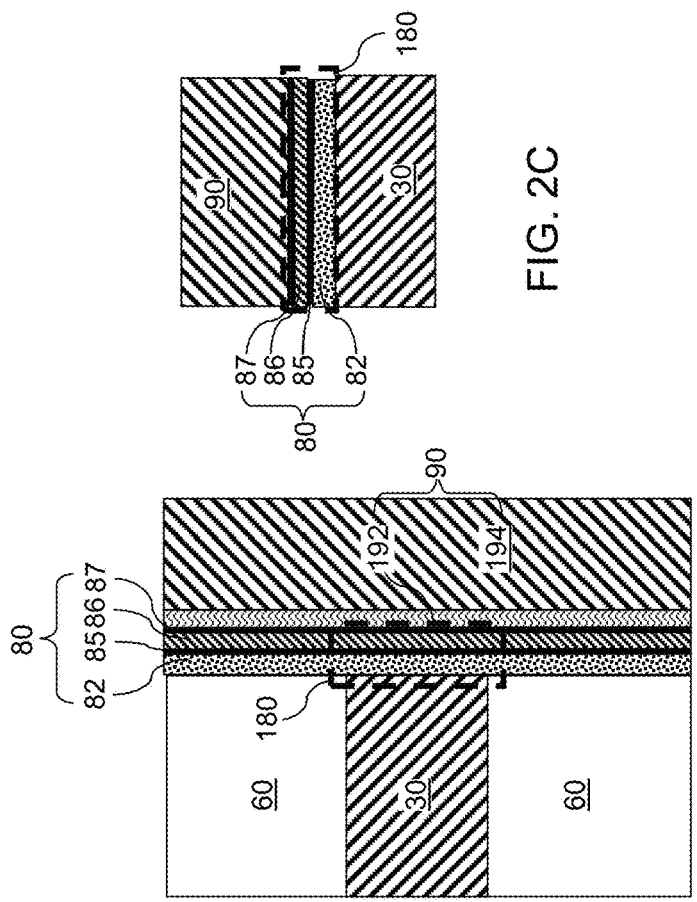
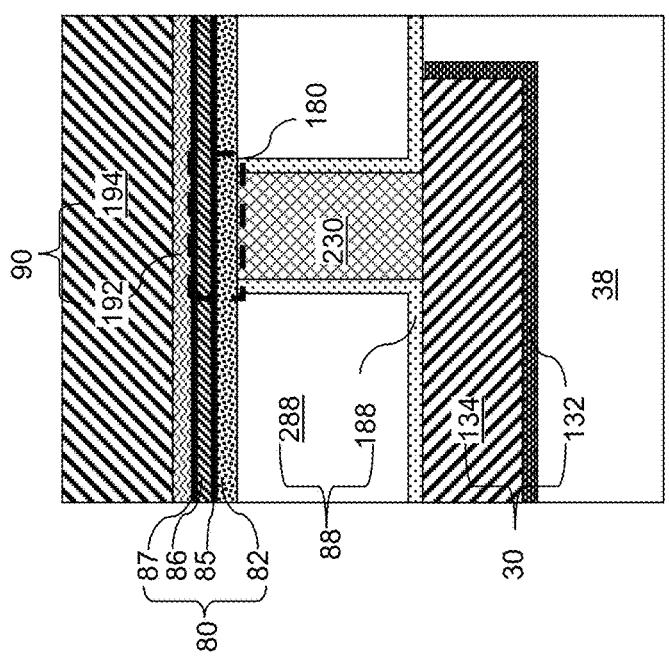
FIG. 2C
FIG. 2B
FIG. 2A

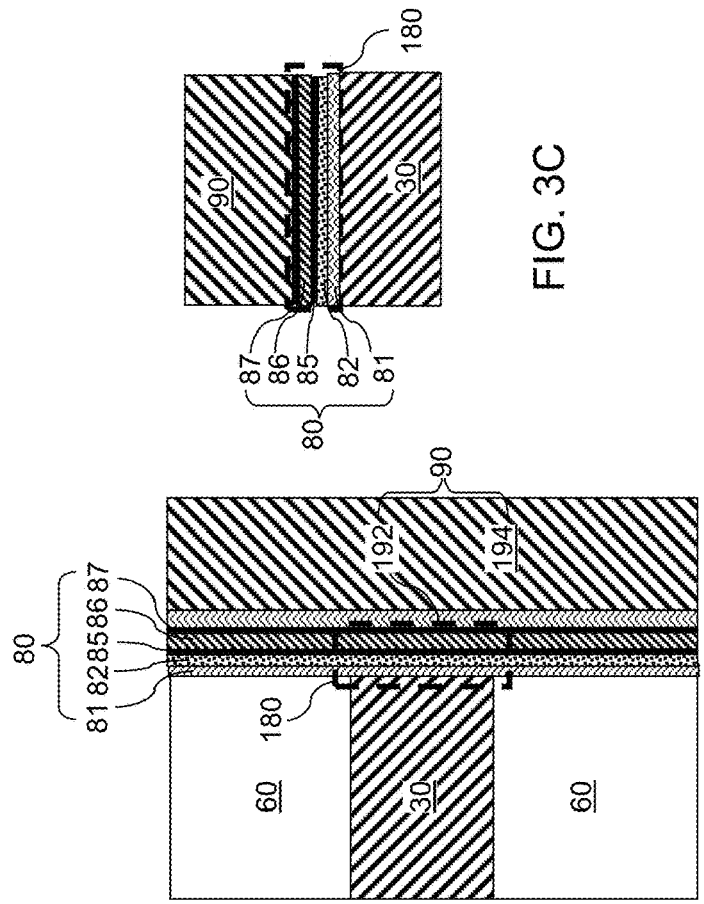

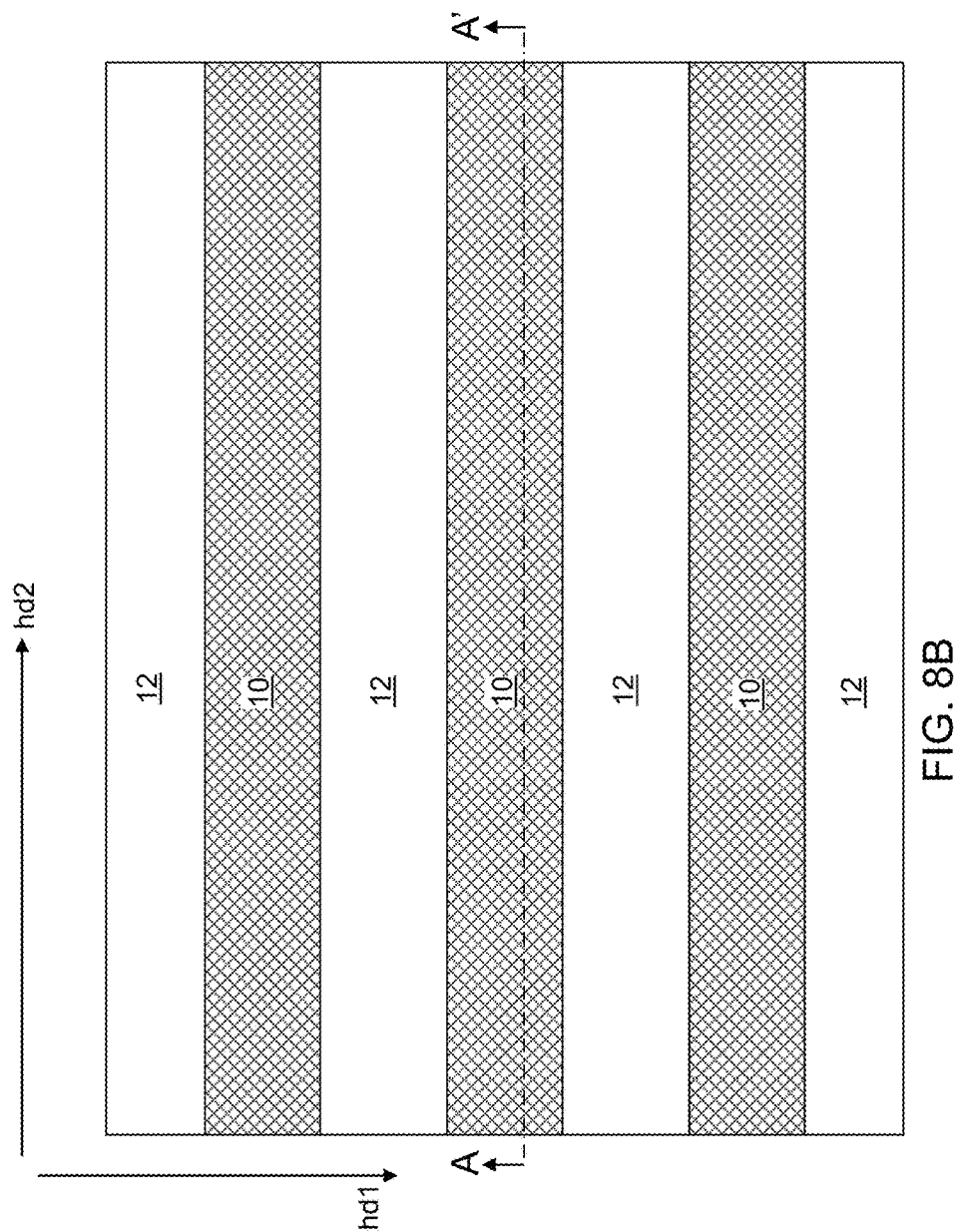

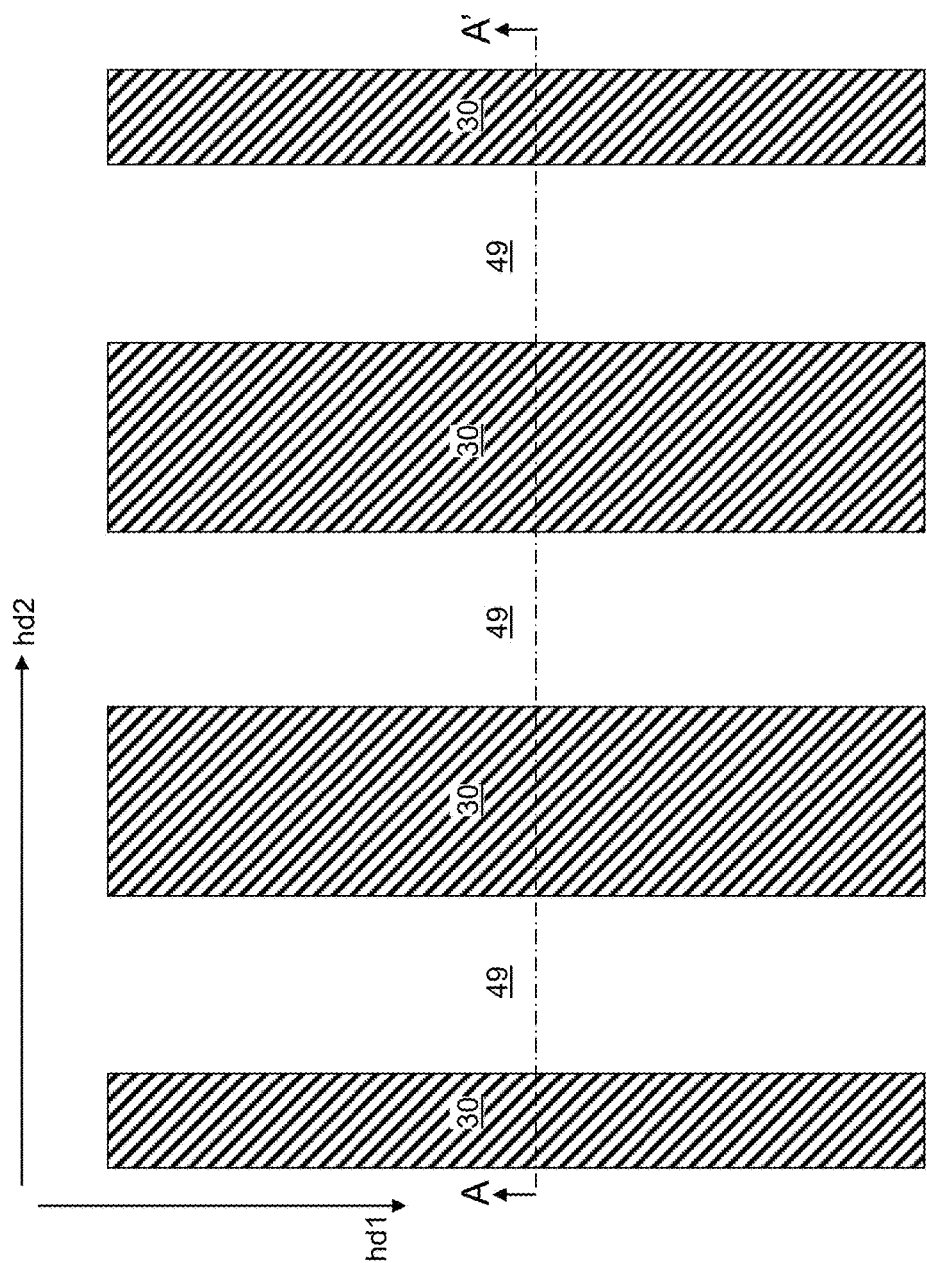

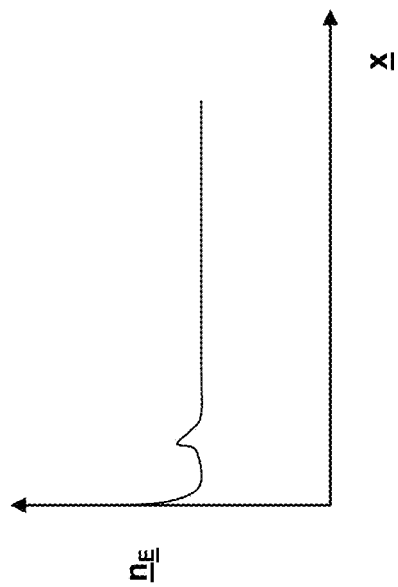
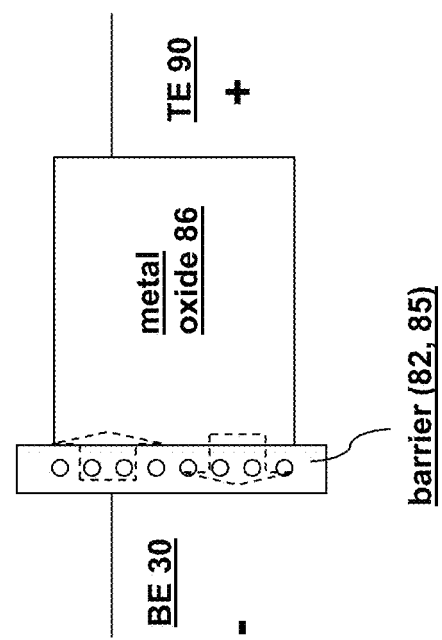
FIG. 14A
FIG. 14B

US 10,340,449 B2

RESISTIVE MEMORY DEVICE CONTAINING CARBON BARRIER AND METHOD OF MAKING THEREOF

FIELD

The present disclosure relates generally to the field of semiconductor devices and specifically to resistive memory devices, and particularly to a resistive memory device containing a carbon barrier modulation material, and methods of making the same.

BACKGROUND

Resistive memory devices employ reversible changes in resistance in a thin film with application of electrical voltage bias. Data stored in a resistive memory element is represented by the resistive state of the resistive memory material. Typically, the stored value of the data in any functional resistive memory device remains the same until the resistive memory element is reprogrammed, for example, in an erase operation or in a programming operation. The data stored in the memory device can be reversed when an electrical bias is applied in a direction that changes the resistive state of the memory device.

The resistive memory element is typically provided as a thin film, which is a solid-state material. Data can be stored in a resistive memory element by changing the resistance of the thin film. The thin film is referred to as a memory film or a read/write film. Examples of resistive random access memory (ReRAM) devices are described in World Intellectual Property Organization (WIPO) Publication No. WO2007004843 A1 to Hong et al. and U.S. Patent Application Publication No. 2013/0043455 A1 to Bateman.

SUMMARY

In one embodiment, a resistive memory device comprises at least one resistive memory element, wherein of the at least one resistive memory element comprises a carbon barrier material portion and a resistive memory material portion that is disposed between a first electrode and a second electrode.

In another embodiment, a method of forming a resistive memory element comprises forming a first electrode, forming a material layer stack including a carbon barrier material portion and a resistive memory material portion over the first electrode, and forming second electrode over the material layer stack.

In another embodiment, a method of operating a resistive random access memory (ReRAM) resistive memory device comprising at least one barrier modulated cell (BMC) comprising a carbon barrier and a metal oxide material that are disposed between a first electrode and a second electrode, comprises applying a first voltage to the BMC to switch the metal oxide material from a higher resistivity state to a lower resistivity state by at least one of oxygen ion and oxygen vacancy diffusion, and applying a second voltage different from the first voltage to the BMC to switch the metal oxide material from the higher resistivity state to the lower resistivity state by at least one of oxygen ion and oxygen vacancy diffusion.

BRIEF DESCRIPTION OF THE DRAWINGS

FIG. 2A is a vertical cross-sectional view of a first configuration of a first exemplary memory cell of the present disclosure.

FIG. 2B is a vertical cross-sectional view of a second configuration of the first exemplary memory cell of the present disclosure.

FIG. 2C is a vertical cross-sectional view of a general configuration of the first exemplary memory cell of the present disclosure.

FIG. 3A is a vertical cross-sectional view of a first configuration of a second exemplary memory cell of the present disclosure.

FIG. 3B is a vertical cross-sectional view of a second configuration of the second exemplary memory cell of the present disclosure.

FIG. 3C is a vertical cross-sectional view of a general configuration of the second exemplary memory cell of the present disclosure.

FIG. 8B is a horizontal cross-sectional view of the first exemplary structure of FIG. 8A along the horizontal plane B-B'. The vertical plane A-A' is the plane of the cross-section for FIG. 8A.

FIG. 8D is a horizontal cross-sectional view of the first exemplary structure of FIG. 8A along the horizontal plane D-D'. The vertical plane A-A' is the plane of the cross-section for FIG. 8A.

FIGS. 14A and 14B are schematic illustrations of operating conditions of the BMC ReRAM device according to an embodiment of the present disclosure.

DETAILED DESCRIPTION

Figure 1:
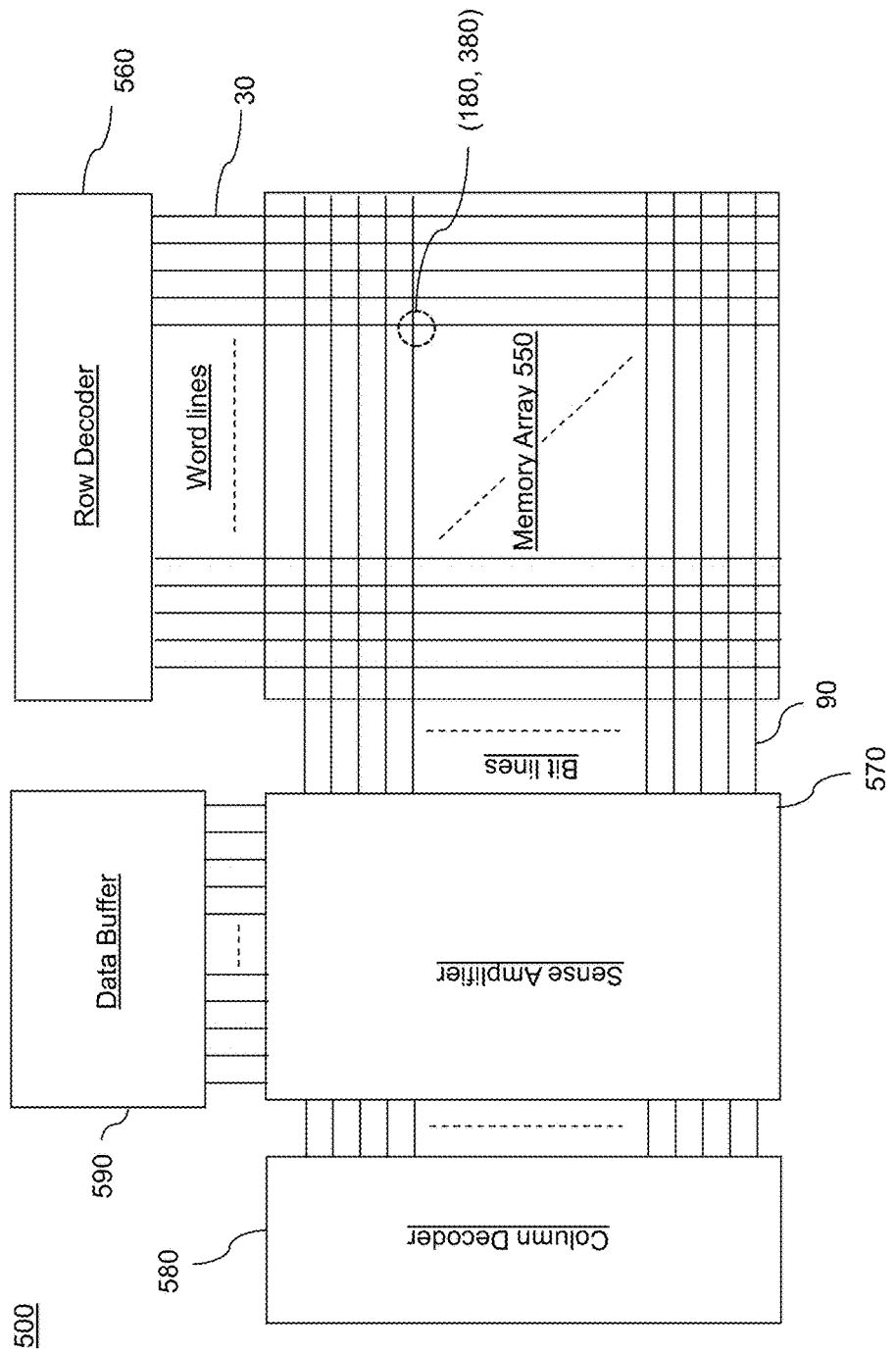
FIG. 1 is a schematic diagram of a random access memory device including memory cells of the present disclosure.

The present disclosure is directed to a BMC ReRAM device containing a carbon barrier modulation material, and methods of making the same, the various aspects of which are described below. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a memory device, such as a memory device employing a resistive memory element, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

Referring to FIG. 1, a schematic diagram for a random access memory device including memory cells of the present disclosure is illustrated. The random access memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element.

The resistive random access memory device 500 of the present disclosure includes a memory array region 550 containing an array of the respective resistive memory elements 180 and optional selector elements 380 located at the intersection of the respective word lines (which can be first electrically conductive lines 30) and bit lines (which can be second electrically conductive lines 90). The device 500 may also contain a row decoder 560 connected to the word lines (which can be the first electrically conductive lines 30), a sense amplifier 570 connected to the bit lines (which can be second electrically conductive lines 90), a column decoder 580 connected to the bit lines (which can be the second electrically conductive lines 90) and a data buffer 590. Multiple instances of the resistive memory element 180 are provided in an array configuration that forms the random access memory device 500. It should be noted that the location of the elements is schematic and the elements may be arranged in a different configuration (e.g., with the word line rows extending left to right in this figure and the bit line columns extending top to bottom in this figure).

Referring to FIG. 2A, a first configuration of a first exemplary memory cell of the present disclosure is illustrated in a vertical cross-sectional view. In this configuration, the resistive memory elements 180 of the present disclosure can be embodied as a cross-point array that is accessed by selecting a first electrically conductive line among a plurality of first electrically conductive lines 30 embedded in a first dielectric material layer 38, and by selecting a second electrically conductive line 90 among a plurality of second electrically conductive lines 90 embedded in a second dielectric material layer. The first dielectric material layer 38 and the second dielectric material layer are spaced from each other by a combination of a dielectric matrix layer 88 and a resistive memory layer stack 80. A two-dimensional array of conductive via structures 230 can be embedded within the dielectric matrix layer 88 at cross points at which the first electrically conductive lines 30 (e.g., word lines) intersect the second electrically conductive lines 90 (e.g., bit lines). In one embodiment, each first electrode can comprises a respective one of the conductive via structures 230 and a respective one of the first electrically conductive lines 30.

The first electrically conductive lines 30 can extend along a first horizontal direction, thereby forming a one-dimensional array of parallel electrically conductive lines that extend along the first horizontal direction. The first electrically conductive lines 30 can include any conductive material known in the art, such as tungsten, copper, aluminum, a conductive metal nitride, or a combination thereof. For example, each first electrically conductive line 30 can include a conductive metallic liner 132 including a conductive metallic nitride (such as TiN) and a conductive fill material portion 134 including a metal (such as W).

The second electrically conductive lines 90 can extend along a second horizontal direction that is different from the first horizontal direction. The second electrically conductive lines 90 can form a one-dimensional array of parallel electrically conductive lines that extend along the second horizontal direction. The second electrically conductive lines 90 can include any conductive material known in the art, such as tungsten, copper, aluminum, a conductive metal nitride, or a combination thereof. For example, each second electrically conductive line 90 can include a conductive metallic liner 192 including a conductive metallic nitride (such as TiN) and a conductive fill material portion 194 including a metal (such as W). In one embodiment, teach of the second electrically conductive lines 90 can be a second electrode of a respective resistive memory device.

The dielectric matrix layer 88 includes at least one dielectric material. The dielectric matrix layer 88 can include an interlayer dielectric (ILD) layer 288, and optionally, a dielectric liner 188. The interlayer dielectric layer 288 includes a dielectric material such as silicon oxide or organosilicate glass. The dielectric liner 188 includes a dielectric material such as silicon nitride and/or a dielectric metal oxide.

The two-dimensional array of conductive via structures 230 can be formed by depositing a conductive material (such as W, Cu, Al, a heavily doped semiconductor material, a metal-semiconductor alloy, or combinations thereof) and patterning the conductive material into a periodic array of pillar structures. Subsequently, the optional dielectric liner 188 and the interlayer dielectric layer 288 can be deposited over the two-dimensional array of conductive via structures 230 and planarized to provide a planar surface. Alternatively, the device shown in FIG. 2A may be fabricated upside down. In this case, the second electrically conductive lines 90 and the second dielectric material layer can be formed first, and the resistive memory layer stack 80 can be formed subsequently. The interlayer dielectric layer 288 can be formed on the surface of the resistive memory layer stack 80, and can be patterned to form a two-dimensional array of via cavities therethrough. After optional deposition and an anisotropic etch of the dielectric liner 188 (of which only vertical portions remain after the anisotropic etch), the two-dimensional array of conductive via structures 230 can be formed in the two-dimensional array of via cavities.

The resistive memory layer stack 80 includes a vertical stack of a carbon barrier material portion 82 as embodied as a planar layer and a resistive memory material portion 86 as embodied as another planar layer. Each region of the resistive memory layer stack 80 that overlies or underlies a conductive via structure 230 constitutes a resistive memory element 180. Optionally, the resistive memory layer stack 80 can further include a first interfacial metal oxide layer 85 formed between the carbon barrier material portion 82 and the resistive memory material portion 86. Additionally or alternatively, the resistive memory layer stack 80 can further include a second interfacial metal oxide layer 87 formed between the resistive memory material portion 86 and the second electrode, i.e., each of the second electrically conductive lines 90.

The lateral spacing between each neighboring pair of conductive via structures 230 is selected such that each resistive memory element 180 is sufficiently electrically insulated from neighboring resistive memory element 180 by inherent resistivity of the materials of the resistive memory layer stack 80. In one embodiment, the ratio of the lateral spacing between a neighboring pair of resistive memory elements 180 to the total thickness of the resistive memory layer stack 80 can be in a range from 4 to 100, such as from 6 to 50.

Referring to FIG. 2B, a second configuration of the first exemplary memory cell of the present disclosure is illustrated in a vertical cross-sectional view. In this configuration, the resistive memory elements 180 can be embodied as a three-dimensional array that is accessed by selecting a word line (which can be a first electrically conductive line 30) among a plurality of word lines spaced from one another by insulating layers 60, and by selecting a vertical bit line (which can be a second electrically conductive line 90) among a plurality of vertical bit lines. The first electrically conductive lines 30 (which can be word lines) and the insulating layers 60 can be formed as an alternating stack of material layers that is patterned to provide vertically coincident sidewalls. A resistive memory layer stack 80 can be formed on the sidewalls of the alternating stack (30, 60) by deposition of material layers.

The resistive memory layer stack 80 includes a lateral stack of a carbon barrier material portion 82 as embodied as a planar layer and a resistive memory material portion 86 as embodied as another planar layer. Each region of the resistive memory layer stack 80 that is located at a level of a word line (i.e., a first electrically conductive line 30) constitutes a resistive memory element 180. The thickness of the insulating layers 60 is selected such that each resistive memory element 180 is sufficiently electrically insulated from neighboring resistive memory element 180 by inherent resistivity of the materials of the resistive memory layer stack 80. In one embodiment, the ratio of the thickness of the insulating layers 60 to the total thickness of the resistive memory layer stack 80 can be in a range from 4 to 100, such as from 6 to 50.

Each of the first electrically conductive lines 30 and the second electrically conductive lines 90 includes at least one conductive material. For example, each second electrically conductive line 90 can include a conductive metallic liner 192 including a conductive metallic nitride (such as TiN) and a conductive fill material portion 194 including a conductive metal (such as W).

Referring collectively to FIGS. 2A and 2B, each resistive memory element 180 can comprise a barrier modulated cell (BMC) which includes a barrier and an electrically conductive metal oxide whose resistivity is switched by at least one of oxygen ion and/or oxygen vacancy diffusion in response to an application of an electric field thereto, as will be described in more detail below with respect to FIGS. 12A to 14B. In one embodiment, each resistive memory element 180 can include a series connection of a carbon barrier material portion 82 and a resistive memory material portion 86 that is disposed between a pair of a first electrode (30, 230) and a second electrode 90. In one embodiment, each resistive memory element 180 can comprise a series connection of a carbon barrier material portion 82, an optional first interfacial metal oxide layer 85, a resistive memory material portion 86, and an optional second interfacial metal oxide layer 87. The first and second interfacial metal oxide layers (85, 87) can be metal oxide barriers. Portion 82 and layer 85 may together comprise a barrier of the BMC ReRAM element.

In one embodiment, each resistive memory material portion 86 can include a metal oxide material having at least two resistive states having different resistivity. Examples of metal oxides that can be employed for the resistive memory material portion 86 include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, each resistive memory material portion 86 may include titanium oxide, such as sub-stoichiometric titanium oxide having less than two oxygen atoms for each titanium atom. In one embodiment, the metal oxide may have a high concentration of free electrons in thermodynamic equilibrium in a range from $1.0\times10^{20}/cm^3$ to $1.0\times10^{21}/cm^3$. The thickness of each resistive memory material portion 86 can be in a range from 5 nm to 30 nm, such as from 9 nm to 15 nm, although lesser and greater thicknesses can also be employed.

In one embodiment, the first interfacial metal oxide layer 85 comprises a first aluminum oxide layer having a thickness in a range from 0.3 nm to 1.0 nm, and the second interfacial metal oxide layer 87 comprises a second aluminum oxide layer having a thickness in a range from 0.3 nm to 1.0 nm. In one embodiment, each of the first interfacial metal oxide layer 85 and the second interfacial metal oxide layer 87 can consist essentially of aluminum oxide. The first and second interfacial metal oxide layers (85. 87) provide regions of a high band gap so that the thickness of the carbon barrier material portion 82 can be reduced.

In one embodiment, the carbon barrier material portion 82 can directly contact each of the first electrodes (30, 230) located on one side of the material layer stack of the resistive memory layer stack 80. In one embodiment, the carbon barrier material portion 82 can directly contact the first interfacial metal oxide layer 85.

In one embodiment, the carbon barrier material portion 82 can comprise a carbon layer having a thickness in a range from 2 nm to 10 nm, such as from 2.5 nm to 5 nm, although lesser and greater thicknesses can also be employed. The carbon material of the carbon barrier material portion 82 can be deposited by plasma enhanced chemical vapor deposition (PECVD), and can also include hydrogen atoms in a range from 14% to 60% in atomic concentration (i.e., atomic percent). In one embodiment, the carbon barrier material portion 82 can consist essentially of amorphous carbon atoms and hydrogen atoms such that the atomic concentration of hydrogen atoms is in a range from 14 at. % to 60 at. %. The material of the carbon barrier material portion 82 is an amorphous carbon material that includes less than 5 volume percent crystalline carbon phase, such as 0 to 5 volume percent crystalline carbon phase. In one embodiment, the amorphous carbon material does not include diamond-like crystallites or graphite crystallites.

The composition and electron bonding characteristics for the carbon material (e.g., amorphous carbon-hydrogen material) deposited by PECVD can vary depending on deposition conditions. For example, an amorphous carbon deposited by a PECVD process employing only one high frequency radio frequency and low ion energy at 350 degrees Celsius can have a refractive index of about 1.97 at 633 nm, extinction coefficient of about 0.10 at 633 nm, density of about 1.16 g/cm$^3$ (at standard condition), about 40% of hydrogen atoms in atomic concentration, sp3 orbital composition of about 8%, near zero crystallinity, as-deposited resistivity greater than $1.0\times10^8$ Ohm-cm (above measurement limit), and post-rapid thermal anneal (RTA) anneal resistivity of about $2.4\times10^1$ Ohm-cm after a rapid thermal anneal at 750 degrees Celsius for 1 minute. An amorphous carbon deposited by a PECVD process employing a high frequency radio frequency and a low frequency radio frequency and high ion energy at 400 degrees Celsius can have a refractive index of about 1.79 at 633 nm, extinction coefficient of about 0.04 at 633 nm, density of about 0.97 g/cm$^3$ (at standard condition), about 58% of hydrogen atoms in atomic concentration, sp3 orbital composition of more than 50%, near zero crystallinity, as-deposited resistivity greater than $1.0 \times 10^8$ Ohm-cm (above measurement limit), and post-rapid thermal anneal (RTA) anneal resistivity of about $2.7 \times 10^4$ Ohm-cm after a rapid thermal anneal at 750 degrees Celsius for 1 minute. While the properties of amorphous carbon films formed by PECVD can vary depending on deposition conditions, high hydrogen content (e.g., from 15% to 60% in atomic concentration) and a high post-RTA resistance can be achieved in the amorphous carbon material of the carbon barrier material portion 82. The post deposition anneal process, such as the RTA process is optional, and the carbon barrier material portion 82 can be formed with, or without, this anneal process. If the carbon barrier material portion 82 is formed without the anneal (e.g., RTA) process, the carbon barrier material portion 82 can be an insulating material having a low level of leakage current. If the carbon barrier material portion 82 is formed with the anneal (e.g., RTA) process, the carbon barrier material portion 82 can be a semiconducting material having a higher level of leakage current.

The resistivity of the carbon barrier material portion 82 can be tuned by selecting the deposition conditions (including the deposition temperature) and the anneal (e.g., RTA) conditions (e.g., presence or absence of the anneal, the anneal temperature and duration at the anneal temperature). For example, an carbon deposited by a PECVD process employing only one high frequency radio frequency and low ion energy at 350 degrees Celsius can as-deposited resistivity greater than $1.0 \times 10^8$ Ohm-cm (above measurement limit), and post-rapid thermal anneal (RTA) anneal resistivity of about $2.4 \times 10^1$ Ohm-cm after a rapid thermal anneal at 750 degrees Celsius for 1 minute. An amorphous carbon deposited by a PECVD process employing only one high frequency radio frequency and low ion energy at 400 degrees Celsius can as-deposited resistivity greater than $1.0 \times 10^8$ Ohm-cm (above measurement limit), and post-rapid thermal anneal (RTA) anneal resistivity of about $1.0 \times 10^1$ Ohm-cm after a rapid thermal anneal at 750 degrees Celsius for 1 minute. An amorphous carbon deposited by a PECVD process employing only one high frequency radio frequency and low ion energy at 450 degrees Celsius can as-deposited resistivity of about $2.0 \times 10^6$ Ohm-cm, and post-rapid thermal anneal (RTA) anneal resistivity of about 5 Ohm-cm after a rapid thermal anneal at 750 degrees Celsius for 1 minute. An amorphous carbon deposited by a PECVD process employing only one high frequency radio frequency and low ion energy at 500 degrees Celsius can as-deposited resistivity of about $3.0 \times 10^3$ Ohm-cm (above measurement limit), and post-rapid thermal anneal (RTA) anneal resistivity of about 1 Ohm-cm after a rapid thermal anneal at 750 degrees Celsius for 1 minute. An amorphous carbon deposited by a PECVD process employing only one high frequency radio frequency and low ion energy at 550 degrees Celsius can as-deposited resistivity of about 100 Ohm-cm (above measurement limit), and post-rapid thermal anneal (RTA) anneal resistivity of about 0.08 Ohm-cm after a rapid thermal anneal at 750 degrees Celsius for 1 minute. The RTA can be conducted for 10 seconds to 2 minutes at a temperature of 600 to 800 degrees Celsius, such as 650 to 750 degrees Celsius. Alternatively, a post deposition furnace anneal can be conducted for 1 to 2 hours at a temperature of 500 to 650 degrees Celsius, such as 550 to 600 degrees Celsius. Thus, a suitable level of resistivity can be selected for the carbon barrier material portion 82. In one embodiment, carbon material having a resistivity in a range from 0.1 Ohm-cm to 100 Ohm-cm may be employed for the carbon barrier material portion 82. Generally, the carbon material of the carbon barrier material portion 82 can remain predominantly amorphous even after the post deposition anneal process. For example, the percentage of the volume that comprises crystalline carbon (e.g., carbon with nucleated basal plane) can be less than 5%. Thus, more than 50%, such as more than 80%, more than 90%, and/or more than 95%, of all volume of the material can be amorphous in the carbon barrier material portion 82 even if an a post deposition anneal process, such as RTA process, is performed to form the carbon barrier material portion 82.

In one embodiment, each first electrode (30, 230) comprises, and may consist of (in case of the structure of FIG. 2B), a portion of a first electrically conductive line 30 that extends along a first direction (which is a horizontal direction), and the second electrode 90 comprises a portion of a second electrically conductive line 90 that extends along a second direction (which may be a horizontal direction as in FIG. 2A or a vertical direction as in FIG. 2B) that is different from the first direction. The series connection of the carbon barrier material portion 82 and the resistive memory material portion 86 can be a portion of a material layer stack (i.e., the resistive memory layer stack 80) located at a region in which the first electrically conductive line 30 and the second electrically conductive line 90 have a minimum spacing therebetween (i.e., at an intersection region of a cross-point array).

In one embodiment, the first electrode (30, 230) can comprise a pillar shaped conductive material portion 230 that contacts a first electrically conductive line 30 that extends along a first direction, and the second electrode 90 can comprise a portion of a second electrically conductive line 90 that extends along a second direction that is different from the first direction. The series connection of the carbon barrier material portion 82 and the resistive memory material portion 86 can be a portion of a material layer stack (i.e., the resistive memory layer stack 80) located at a region in which the pillar shaped conductive material portion 230 and the second electrically conductive line 90 have a minimum spacing therebetween. In another embodiment, the first electrode 30 can be located between insulating material portions of at least one insulating layer (60 or 88), and the carbon barrier material portion 82 can directly contacts the at least one insulating layer (60 or 88).

The exemplary structures of FIGS. 2A and 2B are merely illustrative. Variations of the exemplary structures of FIGS. 2A and 2B can be employed, in which orientations of the various elements and/or the exemplary structures are rotated at an arbitrary angle. Further, the various elements of the exemplary structures can be modified provided that an array of resistive memory elements 180 accessible by selection of conductive lines is present in such modifications. For example, FIG. 2C illustrates a general configuration of the first exemplary memory cell of the present disclosure which may be a cross bar array configuration or another configuration.

Referring to FIG. 3A, a first configuration of a second exemplary memory cell of the present disclosure is illustrated. The first configuration of the second exemplary memory cell can be derived from the first configuration of the first exemplary memory cell illustrated in FIG. 2A by adding an amorphous semiconductor material portion 81 to the resistive memory layer stack 80. The amorphous semiconductor material portion 81 can be disposed between the first electrode (30, 230) and the carbon barrier material portion 82. In one embodiment, the amorphous semiconductor material portion 81 can contact the first electrode (30, 230) and the carbon barrier material portion 82. The amorphous semiconductor material portion comprises a material selected from amorphous silicon, amorphous germanium, and an amorphous silicon-germanium alloy. The thickness of the amorphous semiconductor material portion 81 can be in a range from 0.5 nm to 5 nm, such as from 1 nm to 3 nm, although lesser and greater thicknesses can also be employed.

Referring to FIG. 3B, a second configuration of the second exemplary memory cell of the present disclosure is illustrated. The first configuration of the second exemplary memory cell can be derived from the second configuration of the first exemplary memory cell illustrated in FIG. 2B by adding an amorphous semiconductor material portion 81 to the resistive memory layer stack 80. The amorphous semiconductor material portion 81 can be disposed between the first electrode embodied as the first electrically conductive line 30 and the carbon barrier material portion 82. In one embodiment, the amorphous semiconductor material portion 81 can contact the first electrode 30 and the carbon barrier material portion 82. The amorphous semiconductor material portion comprises a material selected from amorphous silicon, amorphous germanium, and an amorphous silicon-germanium alloy. The thickness of the amorphous semiconductor material portion 81 can be in a range from 0.5 nm to 5 nm, such as from 1 nm to 3 nm, although lesser and greater thicknesses can also be employed.

The exemplary structures of FIGS. 3A and 3B are merely illustrative. Variations of the exemplary structures of FIGS. 3A and 3B can be employed, in which orientations of the various elements and/or the exemplary structures are rotated at an arbitrary angle. Further, the various elements of the exemplary structures can be modified provided that an array of resistive memory elements 180 accessible by selection of conductive lines is present in such modifications. For example, FIG. 3C illustrates a general configuration of the second exemplary memory cell of the present disclosure which may be a cross bar array configuration or another configuration.

Figure 4:
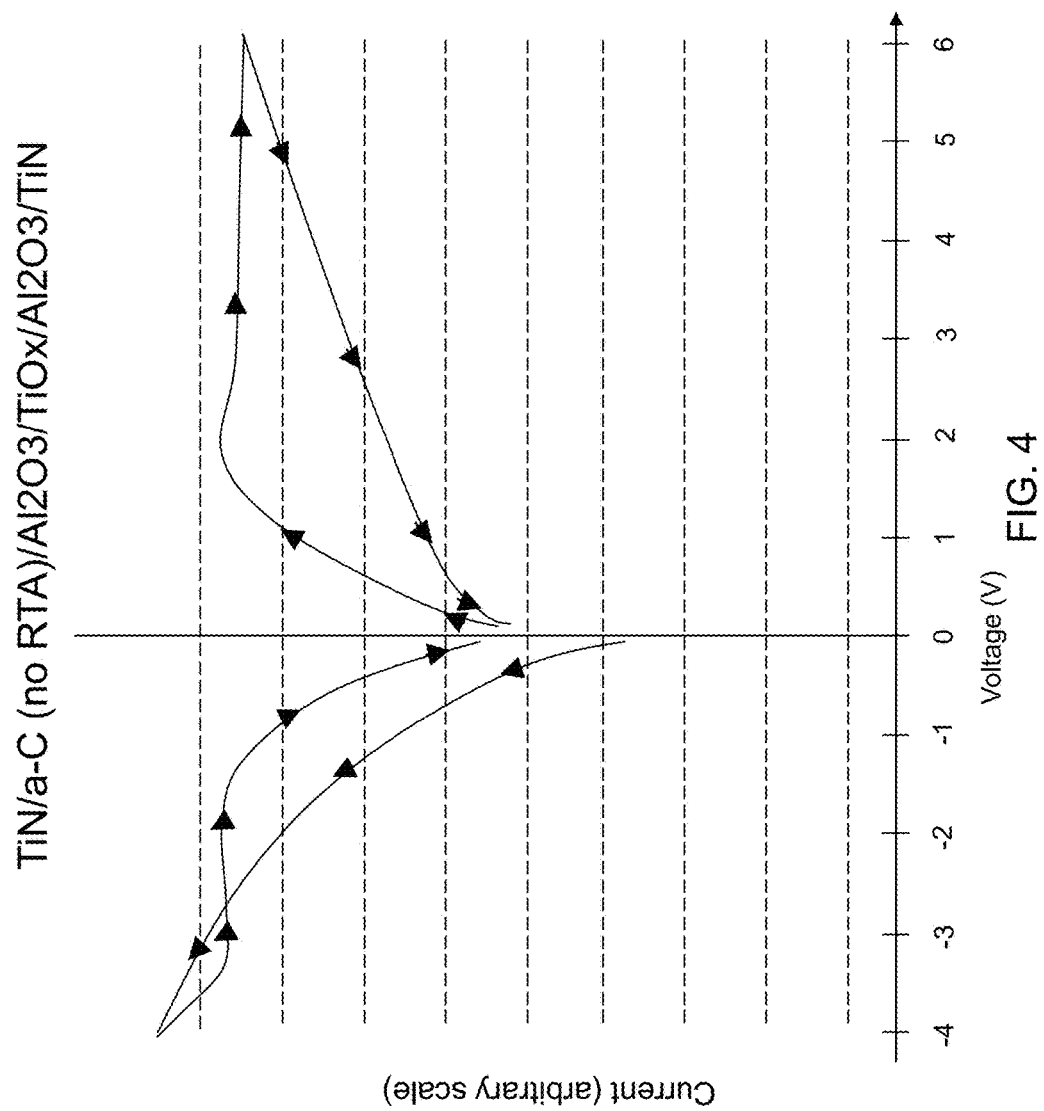
FIG. 4 is a current-voltage (IV) curve of a first sample of the first exemplary memory cell of the present disclosure after four cycles.
Figure 5:
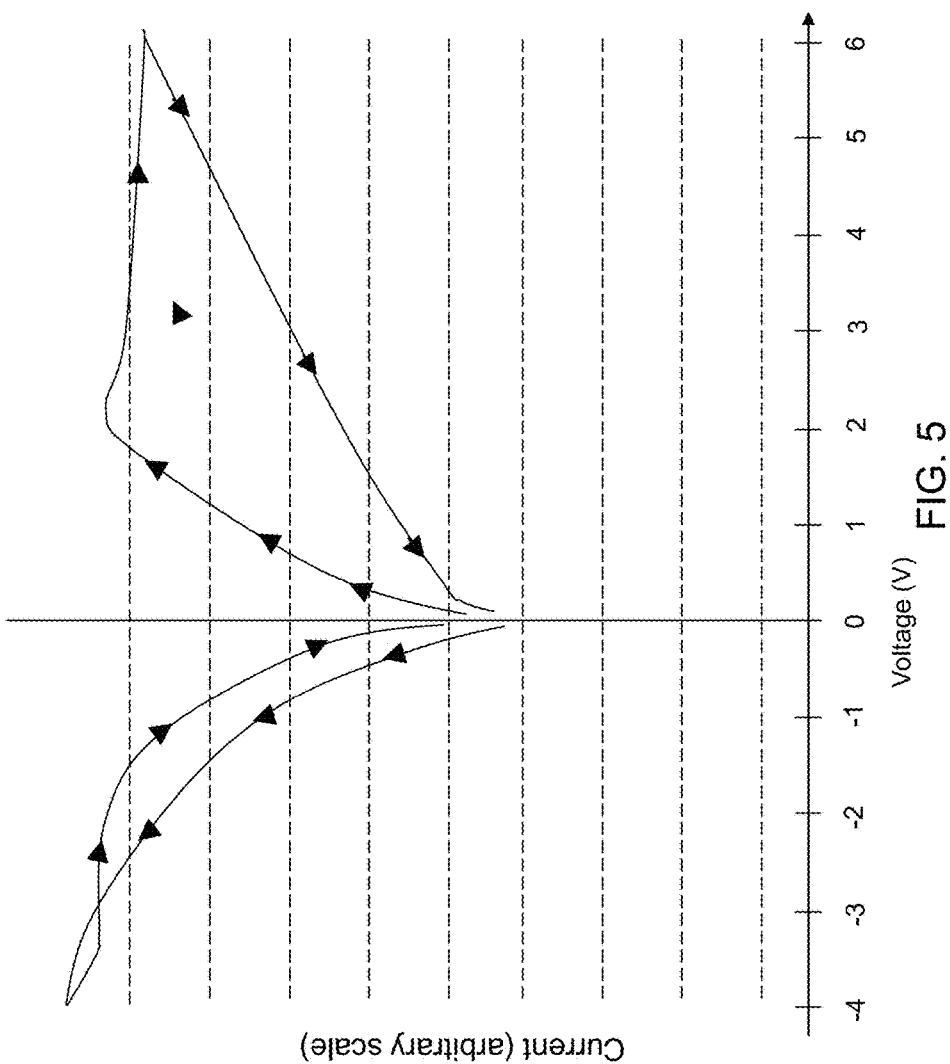
FIG. 5 is a current-voltage (IV) curve of a second sample of the first exemplary memory cell of the present disclosure after four cycles.
Figure 6:
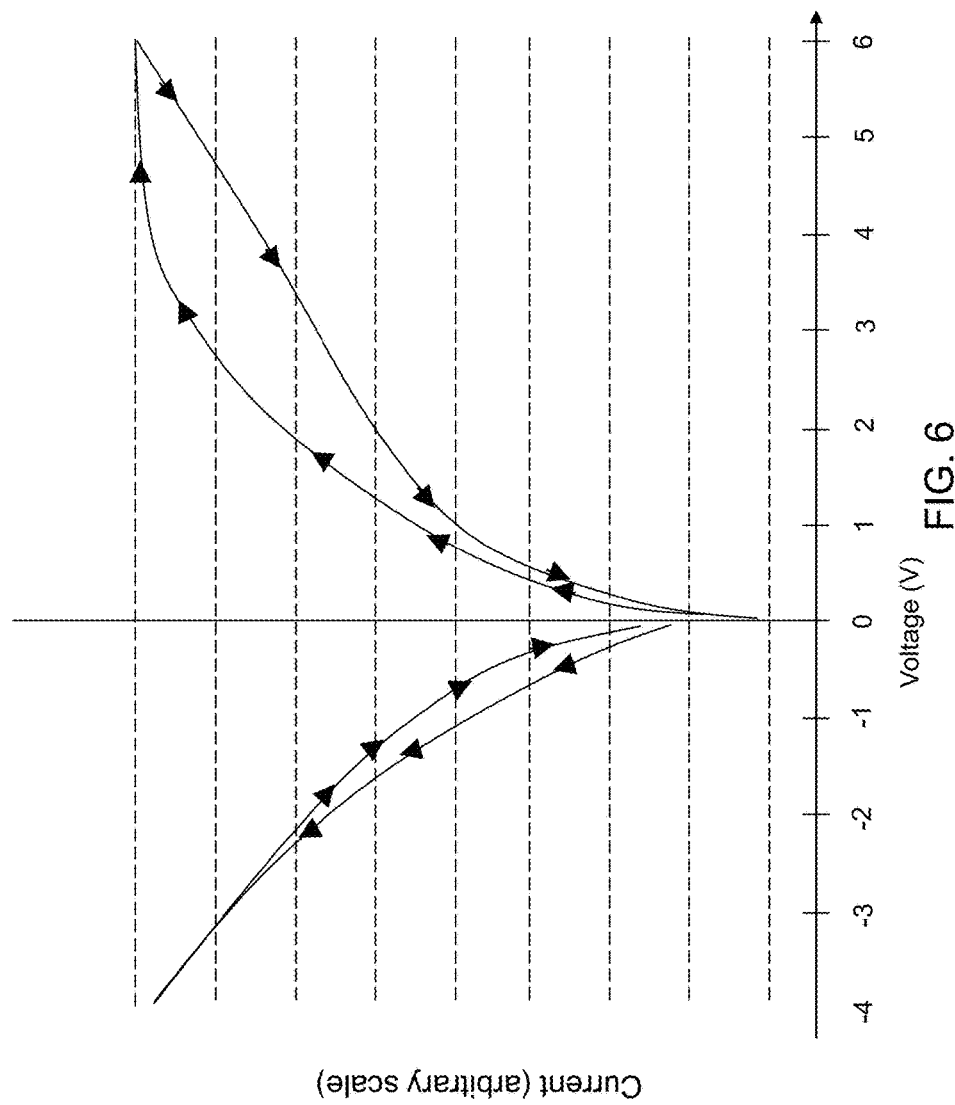
FIG. 6 is a current-voltage (IV) curve of a first sample of the second exemplary memory cell of the present disclosure after four cycles.
Figure 7:
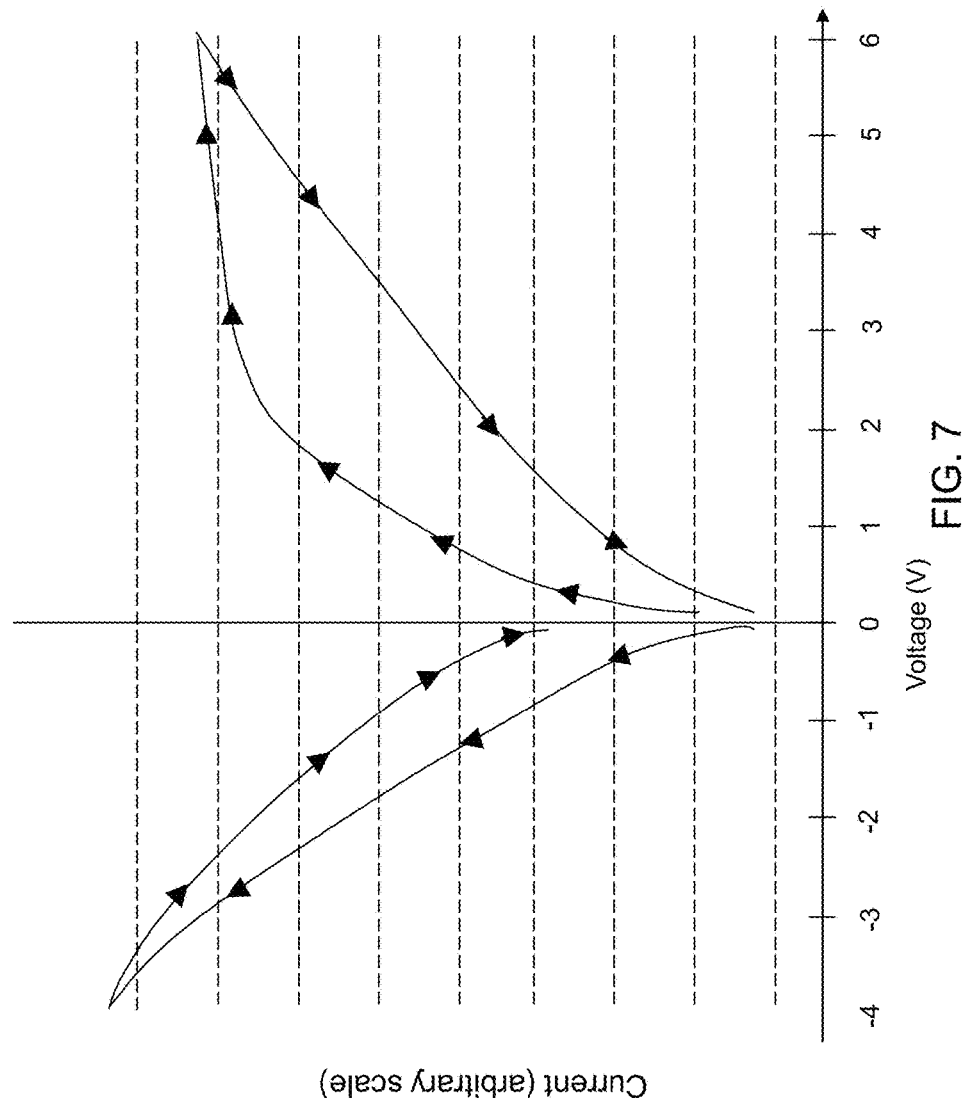
FIG. 7 is a current-voltage (IV) curve of a second sample of the second exemplary memory cell of the present disclosure after four cycles.
Figure 8A:
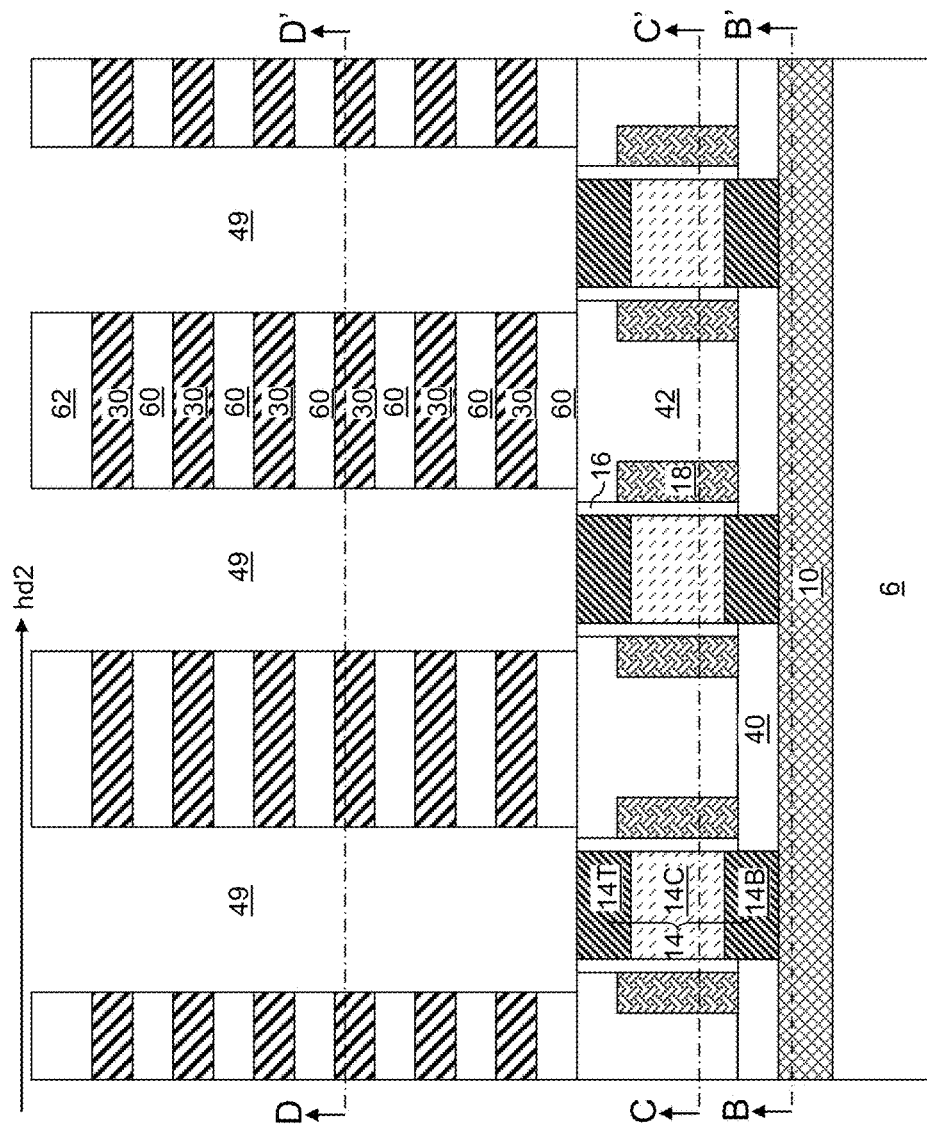
FIG. 8A is a vertical cross-sectional view of a first exemplary structure for forming a resistive random access memory device after formation of bit line access transistors, a dielectric fill layer, and a patterned alternating stack of insulating layers and conductive material layers according to an embodiment of the present disclosure.
Figure 8C:
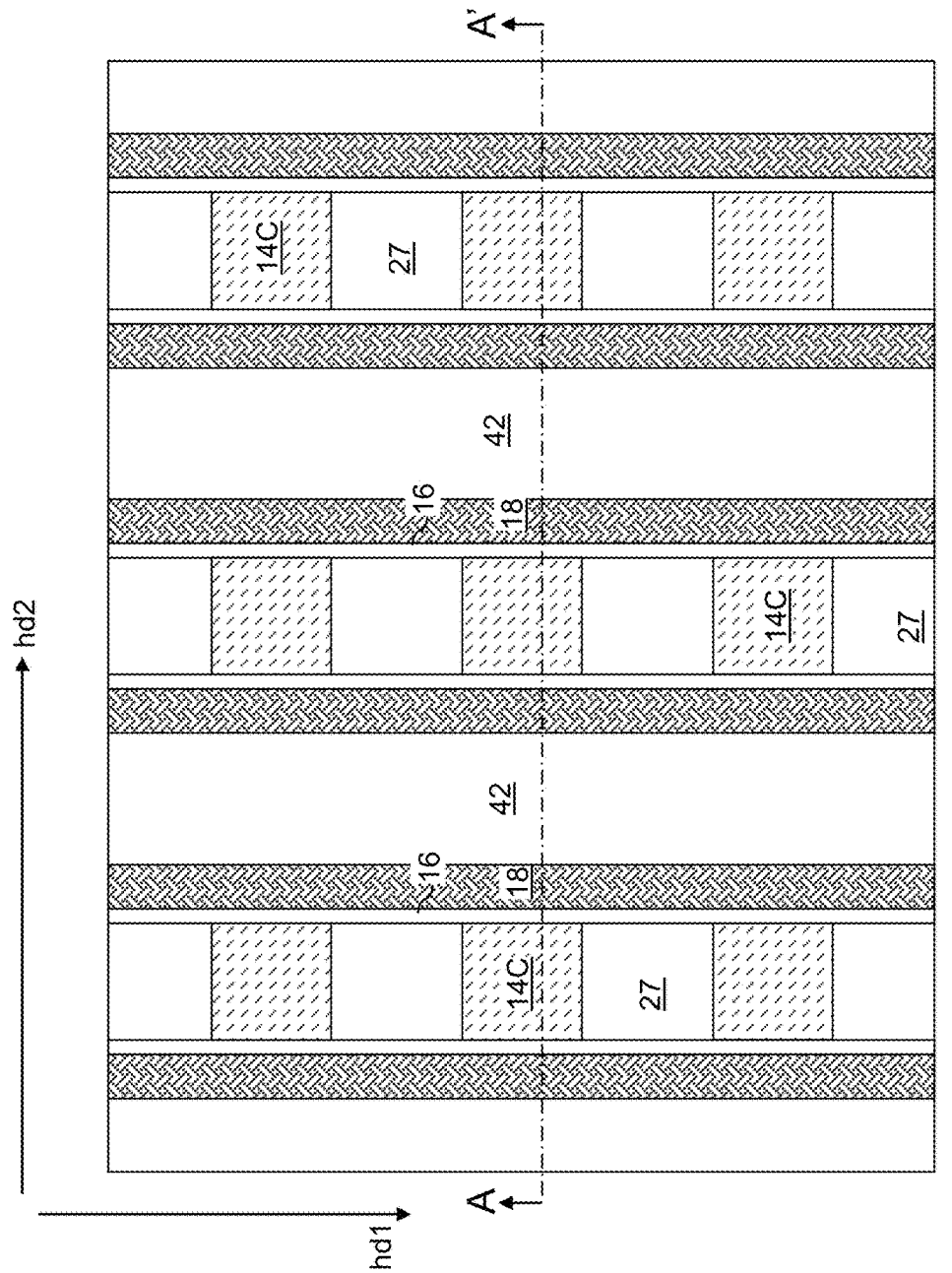
FIG. 8C is a horizontal cross-sectional view of the first exemplary structure of FIG. 8A along the horizontal plane C-C'. The vertical plane A-A' is the plane of the cross-section for FIG. 8A.

FIGS. 4, 5, 6, and 7 illustrate current-voltage (IV) curves of sample memory cells of the embodiments of the present disclosure. FIG. 4 illustrates the current-voltage curve of a first sample memory cell in which the first electrode, the resistive memory layer stack 80, and the second electrode includes, from one side to another, a first TiN layer (as the first electrode 30), a 3 nm thick carbon barrier material portion 82 that is not subjected to a post deposition anneal, a 0.5 nm thick first interfacial metal oxide layer 85 including aluminum oxide, a 9 nm thick resistive memory material portion 86 including oxygen deficient titanium oxide, a 0.5 nm thick second interfacial metal oxide layer 87 including aluminum oxide, and a second TiN layer (as the second electrode 90). FIG. 5 illustrates the current-voltage curve of a second sample memory cell in which the first electrode, the resistive memory layer stack 80, and the second electrode includes, from one side to another, a first TiN layer (as the first electrode), a 3 nm thick carbon barrier material portion 82 annealed at 650 degrees Celsius for 1 minute after deposition, a 0.5 nm thick first interfacial metal oxide layer 85 including aluminum oxide, a 9 nm thick resistive memory material portion 86 including oxygen deficient titanium oxide, a 0.5 nm thick second interfacial metal oxide layer 87 including aluminum oxide, and a second TiN layer (as the second electrode). FIG. 6 illustrates the current-voltage curve of a third sample memory cell in which the first electrode, the resistive memory layer stack 80, and the second electrode includes, from one side to another, a first TiN layer (as the first electrode), a 3 nm thick amorphous semiconductor material portion 81 including amorphous silicon, a 3 nm thick carbon barrier material portion 82 that is not subjected to a post deposition anneal, a 0.5 nm thick first interfacial metal oxide layer 85 including aluminum oxide, a 9 nm thick resistive memory material portion 86 including oxygen deficient titanium oxide, a 0.5 nm thick second interfacial metal oxide layer 87 including aluminum oxide, and a second TiN layer (as the second electrode). FIG. 7 illustrates the current-voltage curve of a fourth sample memory cell in which the first electrode, the resistive memory layer stack 80, and the second electrode includes, from one side to another, a first TiN layer (as the first electrode), a 3 nm thick amorphous semiconductor material portion 81 including amorphous silicon, a 3 nm thick carbon barrier material portion 82 annealed at 650 degrees Celsius for 1 minute after deposition, a 0.5 nm thick first interfacial metal oxide layer 85 including aluminum oxide, a 9 nm thick resistive memory material portion 86 including oxygen deficient titanium oxide, a 0.5 nm thick second interfacial metal oxide layer 87 including aluminum oxide, and a second TiN layer (as the second electrode).

During cycling between 6 V and −4 V for the voltage applied to the second electrode with respective to the first electrode, the current-voltage curves of the first through fourth sample memory cells display hysteresis in the non-linear resistivity of the resistive memory elements 180. A positive voltage of about 6 V (as applied to the second electrode with respect to the first electrode) is sufficient to program the resistive memory element 180 into a high resistance (i.e., higher resistivity) state. A negative voltage of about −4 V (as applied to the second electrode with respect to the first electrode) is sufficient to program the resistive memory element 180 into a low resistance (i.e., lower resistivity) state. Difference in resistivity greater than one order of magnitude is displayed in a respective voltage range, which can be, for example, between 1.0 V and 3.0 V.

Thus, in one embodiment, a method of programming the BMC 180 includes applying a first voltage (e.g., a first polarity voltage, such as a negative voltage) to the BMC to switch the metal oxide material 86 from a higher resistivity state to a lower resistivity state by at least one of oxygen ion and oxygen vacancy diffusion. The method also includes applying a second voltage (e.g., an opposite second polarity voltage, such as a positive voltage) different from the first voltage to the BMC 180 to switch the metal oxide material 86 from the higher resistivity state to the lower resistivity state by at least one of oxygen ion and oxygen vacancy diffusion.

A read circuit providing a suitable read voltage (which is in the range that provides difference in read current due to the difference in resistivity) can be employed to perform a read operation without affecting the resistive state of the resistive memory element of the exemplary memory cells of the present disclosure. The programming voltages and the read voltages can be optimized as needed. Thus, the read current and the ratio of the on/off read current can be optimized by selecting the post deposition anneal conditions (or omitting the anneal) and/or by whether the memory cell contains the amorphous semiconductor material portion 81.

Referring to FIGS. 8A-8D, a first exemplary structure for forming a resistive random access memory device is illustrated, which can be an in-process ReRAM device. As used herein, a "prototype" structure or an "in-process" structure refers to a transient structure that is subsequently modified in the shape or composition of at least one component therein.

The first exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense circuitry (e.g., sense amplifier), input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and first electrically conductive line select transistor for selecting first electrically conductive lines to be activated.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first semiconductor layer. The semiconductor layer stack 14 is patterned employing a combination of lithographic methods and an anisotropic etch such that each patterned portion of the semiconductor layer stack 14 overlies an area of a respective global bit line 10 and is laterally spaced from one another by trenches extending along the second horizontal direction hd2. Subsequently, a dielectric material (such as silicon nitride and/or silicon oxide) is deposited in the trenches and planarized to remove the dielectric material from above rails of the semiconductor layer stack 14 that extend along the second horizontal direction hd2. The remaining portions of the semiconductor layer stack 14 and the planarized dielectric material portions constitute alternating rail structures in which rails of semiconductor layer stack 14 and rails of the planarized dielectric material extend along the second horizontal direction hd2 and alternate along the first horizontal direction hd1.

The remaining portions of the semiconductor layer stack 14 and the planarized dielectric material portions are patterned to form trenches that extend along the first horizontal direction hd1. Each patterned portion of the semiconductor layer stack 14 includes a vertical stack of a bottom active region 14B, a semiconductor channel 14C, and a top active region 14T. Each patterned portion of the dielectric material constitutes a dielectric pillar structure 27, which can be located between a pair of vertical stacks of a bottom active region 14B, a semiconductor channel 14C, and a top active region 14T that are spaced from each other along the first horizontal direction hd1. Each alternating sequence of dielectric pillar structures 27 and vertical stacks of a bottom active region 14B, a semiconductor channel 14C, and a top active region 14T that extend along the first horizontal direction hd1 forms a composite rail structure (14B, 14C, 14T, 27). The composite rail structures (14B, 14C, 14T, 27) are laterally spaced from one another along the second horizontal direction hd2. Top surfaces of the global bit lines 10 and the separator dielectric portions 12 can be physically exposed at the bottom of each trench that laterally extends along the first horizontal direction hd1.

A spacer dielectric layer 40 can be formed at the bottom the trenches by depositing a self-planarizing dielectric material (such as spin-on glass) or by filling the trenches with a dielectric material (such as organosilicate glass), planarizing the deposited dielectric material, and recessing the dielectric material selective to the dielectric pillar structures 27 and the vertical stacks of the bottom active regions 14B, the semiconductor channels 14C, and the top active regions 14T. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include contiguous portions of the semiconductor layer stack 14 and the dielectric pillar structures 27 that are present between a pair of trenches) by a planarization process, which can employ, for example, chemical mechanical planarization. Each remaining portion of the deposited dielectric material in the trenches constitutes a dielectric rail structure 42.

Each dielectric rail structure 42 extends along the first horizontal direction hd1 parallel to the composite rail structures (14B, 14C, 14T, 27). Each composite rail structure (14B, 14C, 14T, 27) includes remaining portions of the semiconductor layer stack 14 and the dielectric pillar structures 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the substrate 6. In one embodiment, each dielectric rail structure 42 can include at least one dielectric material such as silicon nitride and/or silicon oxide. The dielectric rail structures 42 and the composite rail structures (14T, 14C, 14B, 27) alternate along the second horizontal direction hd2.

Subsequently, an alternating stack of spacer material layers and insulating layers 60 can be formed over the one dimensional array of the dielectric rail structures 42 and the composite rail structures (14B, 14C, 14T, 27). An insulating cap layer 62 can be formed over the alternating stack. In one embodiment, the spacer material layers can be first electrically conductive lines 30 that remain in a final device structure. In another embodiment, the spacer material layers can be sacrificial material layers that are subsequently replaced electrically conductive layers, as will be described in more detail below. The insulating cap layer 62 includes a dielectric material that may be the same as, or different from, the dielectric material of the insulating layers 60. For example, the insulating layers 60 can include undoped silicate glass (e.g., silicon oxide) or doped silicate glass, and the insulating cap layer 62 can include undoped silicate glass, doped silicate glass, silicon nitride, or a dielectric metal oxide.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the insulating cap layer 62 and the alternating stack of the first electrically conductive lines 30 and the insulating layers 60 can be patterned to form line trenches 49 that extend along the first horizontal direction hd1. Each line trench 49 can overlie the area of a respective composite rail structure (14B, 14C, 14T, 27). Each contiguous set of remaining portions of the first electrically conductive lines 30 and the insulating layers 60 between a pair of line trenches 49 constitutes an alternating stack (30, 60) that is a rail structure. Each alternating stack (30, 60) overlies a respective dielectric rail structure 42, extends along the first horizontal direction hd1, and is laterally spaced apart from other alternating stacks (30, 60) along the second horizontal direction hd2. Each patterned first electrically conductive line 30 can constitute a first electrically conductive line of a resistive random access memory device. In one embodiment, each alternating stack (30, 60) can have a lesser width along the second horizontal direction hd2 than the underlying dielectric rail structure 42, and can be entirely within the area of the underlying dielectric rail structure 42.

In one embodiment, the first electrically conductive lines 30 comprise a first electrically conductive material. In one embodiment, the first electrically conductive material can include an elemental metal, an inter metallic alloy, and/or a conductive metal nitride.

The thickness of the first electrically conductive lines 30 can be in a range from 5 nm to 60 nm, although lesser and greater thicknesses can also be employed. The thickness of the insulating lines 60 can be in a range from 5 nm to 60 nm, although lesser and greater thicknesses can also be employed. The thickness of the insulating cap layer 62 can be in a range from 5 nm to 300 nm, although lesser and greater thicknesses can also be employed.

A pair of a first electrically conductive line 30 and an insulating layer 60 can constitute a unit of repetition in the alternating stack (30, 60) of the first electrically conductive lines 30 and the insulating layers 60. The total number of repetitions can be in a range from 8 to 1,024, although lesser and greater number of repetitions can also be employed. Thus, a plurality of alternating stacks (30, 60) of insulating layers 60 and first electrically conductive lines 30 is formed over a substrate 6. Each of the insulating layers 60 and the first electrically conductive lines 30 extends along the first horizontal direction (i.e., the first electrically conductive line direction) hd1. The alternating stacks (30, 60) are laterally spaced from one another along the second horizontal direction hd2 (i.e., the global bit line direction).

Figure 9A:
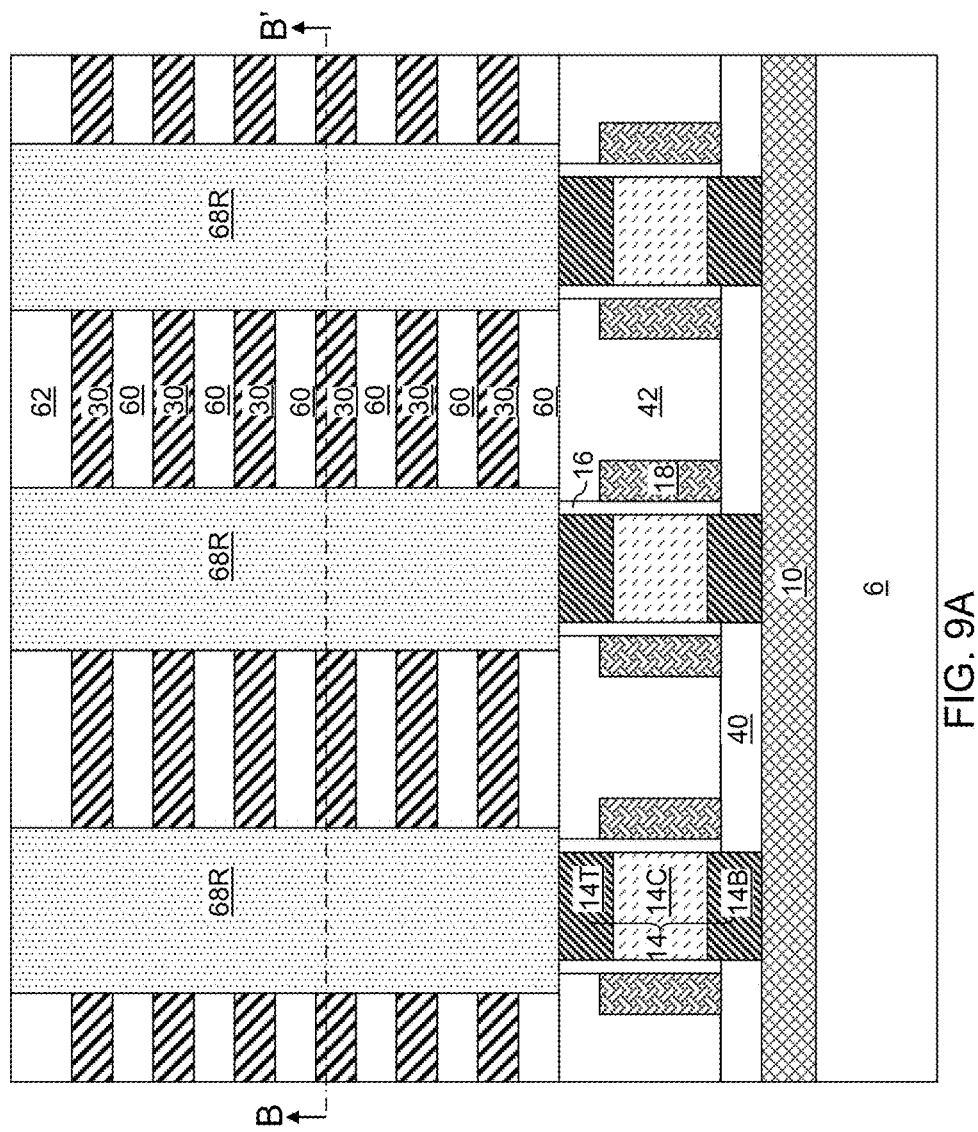
FIG. 9A is a vertical cross-sectional view of the first exemplary structure after formation of dielectric trench fill structures according to an embodiment of the present disclosure.
Figure 9B:
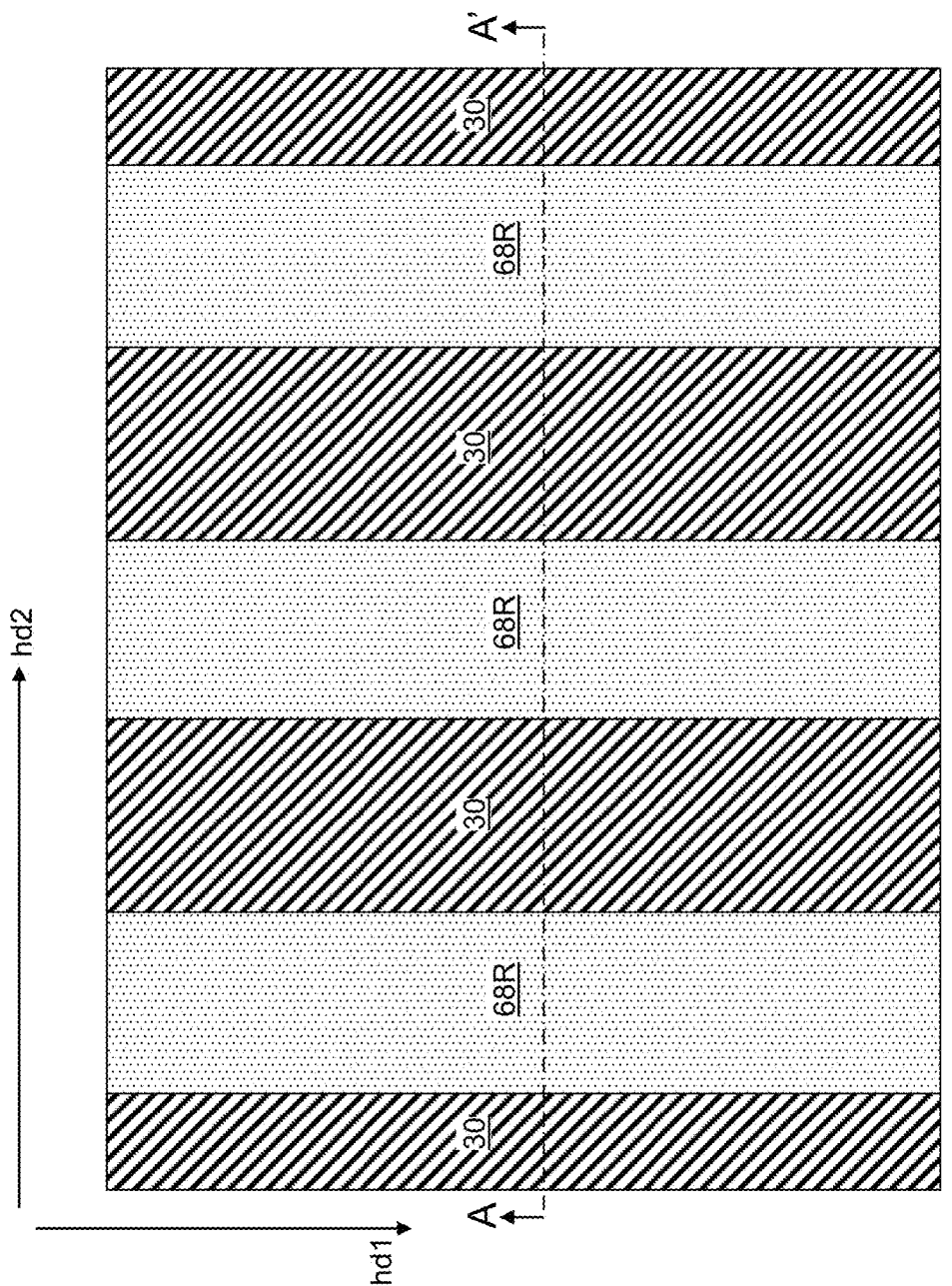
FIG. 9B is a horizontal cross-sectional view of the exemplary structure of FIG. 9A along the horizontal plane B-B'. The vertical plane A-A' is the plane of the cross-section for FIG. 9A.

Referring to FIGS. 9A and 9B, a dielectric material is deposited to fill the line trenches 49. The dielectric material can be removed from above a horizontal plane including the top surfaces of the insulating cap layers 62. Each remaining portion of the dielectric material filling a line trench 49 constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass (e.g., silicon oxide), silicon nitride, organosilicate glass, or porous derivatives thereof. In an illustrative example, the insulating layers 60 can include undoped silicate glass (e.g., $SiO_2$) or doped silicate glass, the insulating cap layers 62 can include silicon nitride or a dielectric metal oxide, and the separator rail structures 68R can include doped silicate glass, undoped silicate glass, or organosilicate glass.

Figure 10A:
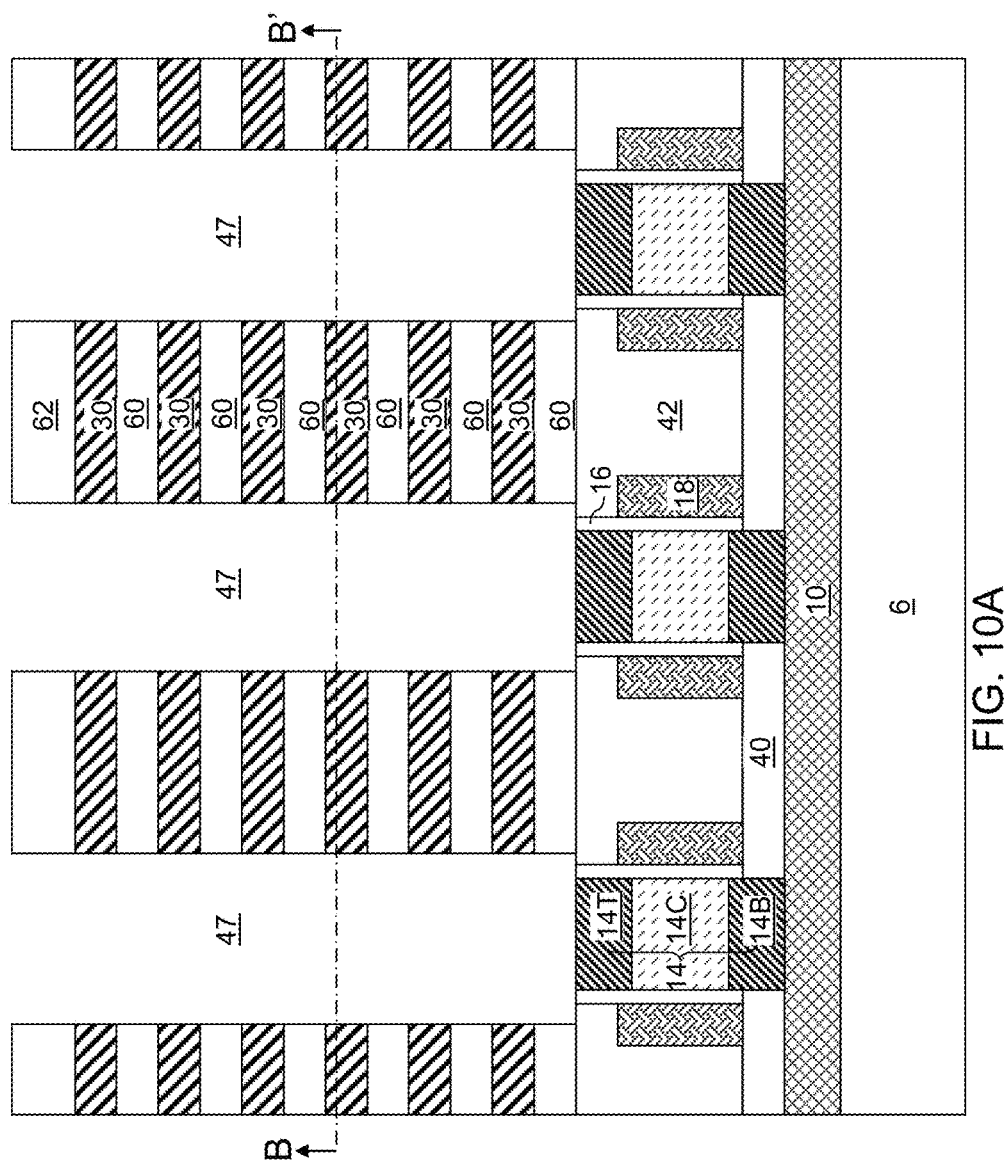
FIG. 10A is a vertical cross-sectional view of the first exemplary structure after formation of dielectric pillar structures and bit line openings according to an embodiment of the present disclosure.
Figure 10B:
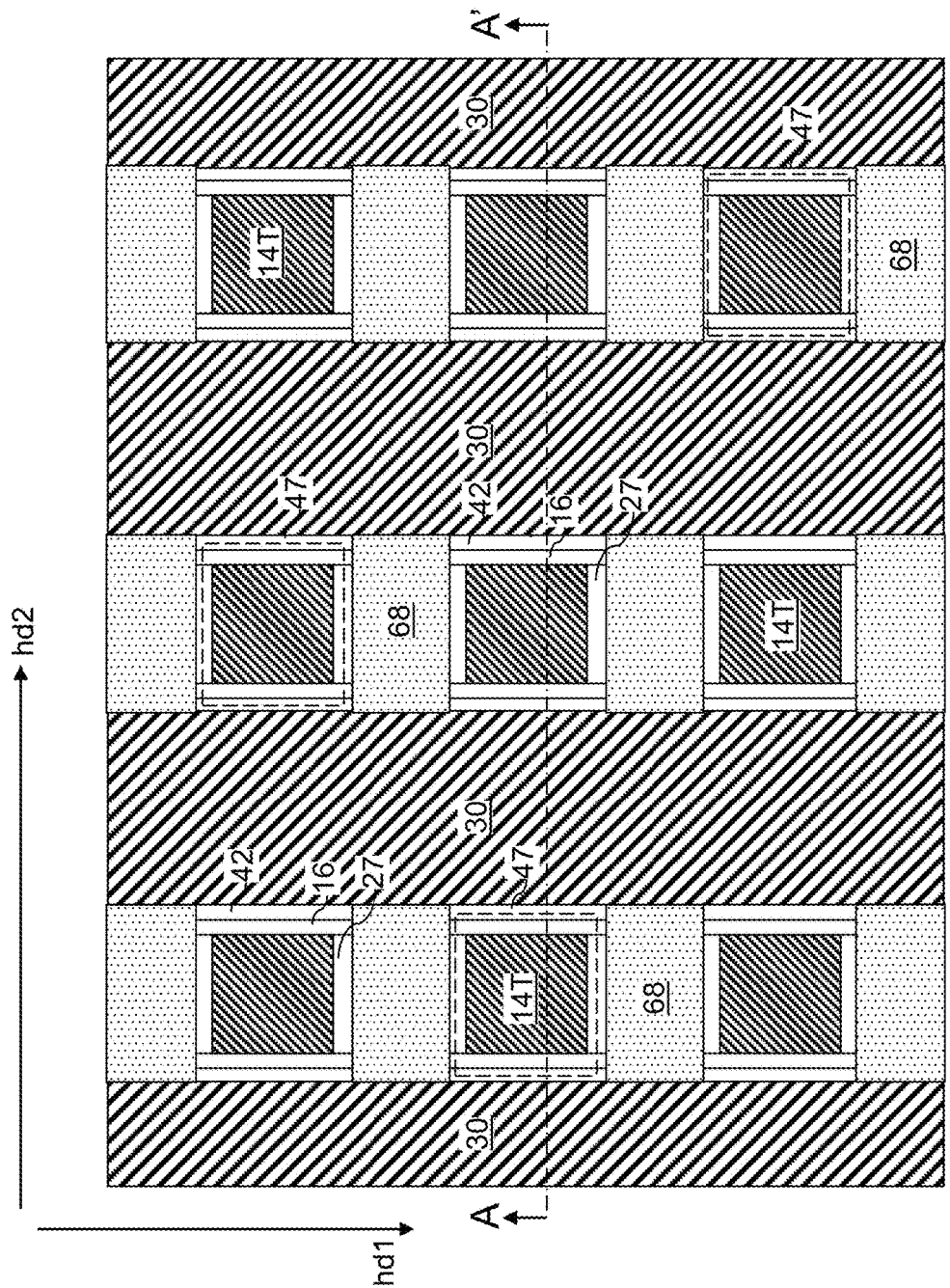
FIG. 10B is a horizontal cross-sectional view of the exemplary structure of FIG. 10A along the horizontal plane B-B'. The vertical plane A-A' is the plane of the cross-section for FIG. 10A.

Referring to FIGS. 10A and 10B, bit line cavities 47 can be formed by patterning the separator rail structures 68R into separator pillar structures 68. Specifically, a photoresist layer (not shown) can be applied over the insulating cap layers 62 and the separator rail structures 68R, and can be lithographically patterned to form linear portions that overlie areas of the separator dielectric material portions 12. Line trenches extending along the second horizontal direction hd2 and overlying areas of the global bit lines 10 are formed between remaining portions of the photoresist layer.

An anisotropic etch that removes the dielectric material of the separator rail structures 68R selective to the dielectric material of the insulating cap layers 62 can be performed to remove portions of the separator rail structures 68R that are not covered by a combination of the photoresist layer portions and insulating cap layers 62. Bit line cavities 47 having rectangular horizontal cross-sectional areas and extending through the alternating stacks (30, 60) to top surfaces of the top active regions 14T can be formed, thereby separating the separator rail structures 68R into separator pillar structures 68. The bit line cavities 47 can form a two-dimensional rectangular array. The separator pillar structures 68 can form another two-dimensional rectangular array having the same periodicity as the two-dimensional rectangular array of the bit line cavities 47.

While an embodiment in which the area of each bit line cavity 4'7 is greater than the area of an underlying top active region 14T, embodiments are expressly contemplated herein in which the area of each bit line cavity 47 is substantially the same as, or is less than, the area of an underlying top active region 14T. Further, the geometrical center of each bit line cavity 47 may be located on a vertical line passing through the geometrical center of an underlying vertical stack of a bottom active region 14B, a semiconductor channel 14C, and a top active region 14T, or may be laterally offset from the vertical line due to an overlay variation during the patterning processes employed to form pattern the alternating stacks (30, 60) and the separator pillar structures 68.

Figure 11A:
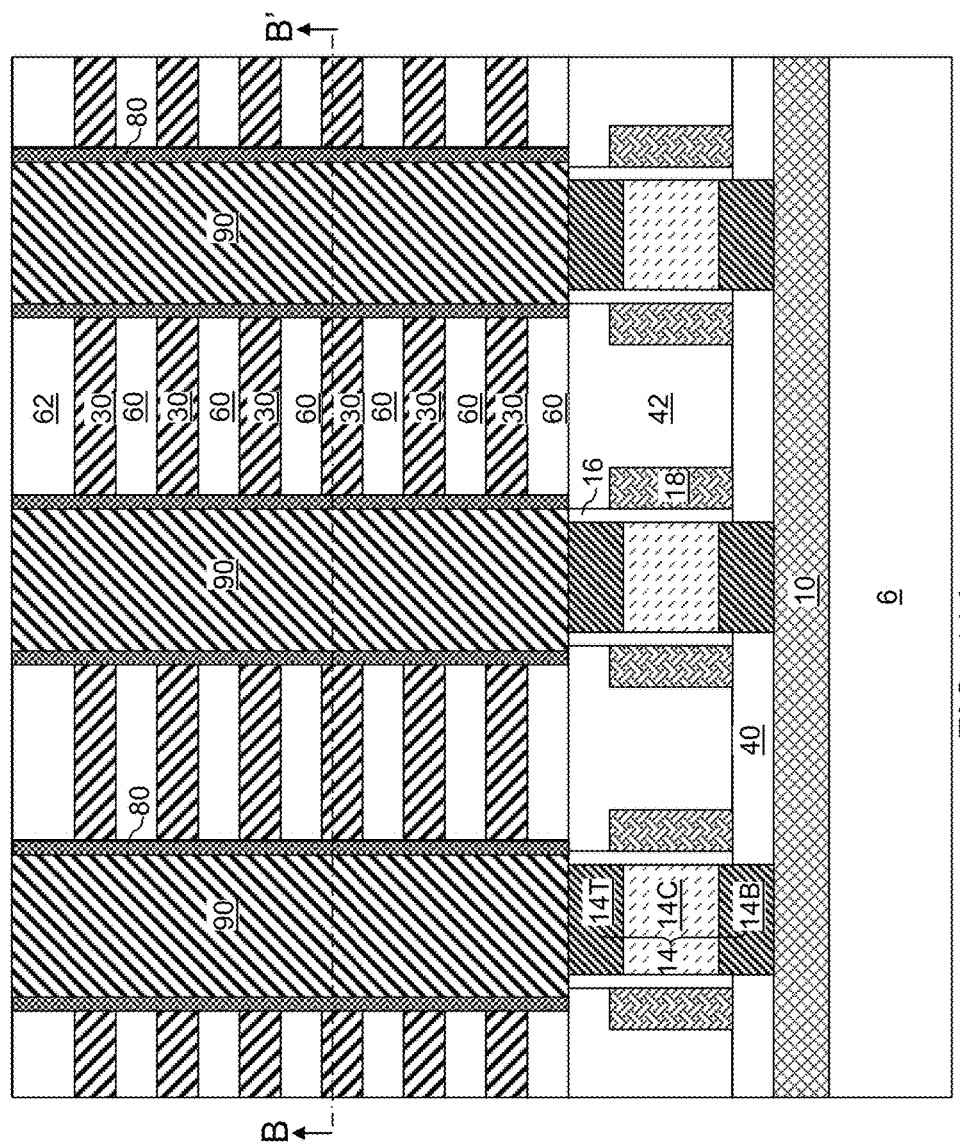
FIG. 11A is a vertical cross-sectional view of the first exemplary structure after formation of resistive memory layers and bit line structures according to an embodiment of the present disclosure.
Figure 11B:
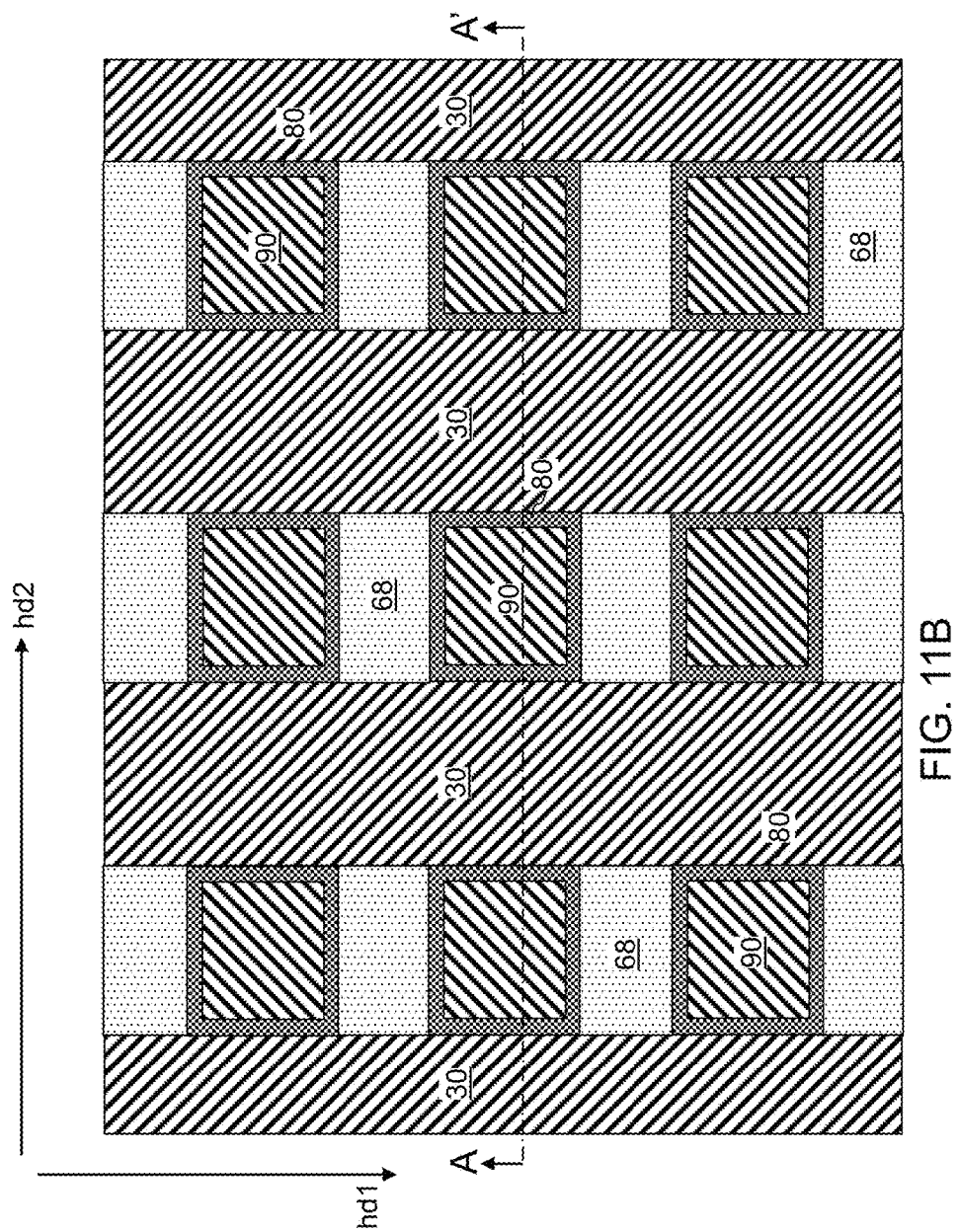
FIG. 11B is a horizontal cross-sectional view of the exemplary structure of FIG. 11A along the horizontal plane B-B'. The vertical plane A-A' is the plane of the cross-section for FIG. 11A.

Referring to FIGS. 11A and 11B, a resistive memory layer stack 80 can be formed on each sidewall of the bit line cavities 47. The resistive memory layer stack 80 can be any of the resistive memory layer stacks 80 described above. At least one conductive material is deposited in each remaining volume of the bit line cavities 47 to form the second electrically conductive lines 90 (which can be local bit lines that extend vertically). The at least one conductive material can include an elemental metal (e.g., W, Ti, etc.), an intermetallic alloy, a conductive doped semiconductor material, and/or a conductive compound including at least one metal and at least one non-metal element such as a conductive metal nitride e.g., TiN). Excess portions of the at least one conductive material can be removed from above the top surface of the insulating cap layers 62, for example, by a planarization process (such as chemical mechanical planarization and/or a recess etch).

The first electrically conductive lines 30 and the global bit lines 10, and optionally, the second electrically conductive lines 90 (i.e., the vertical bit lines) can be suitably electrically wired for operation as a resistive random access memory device.

Referring collective to all drawings of the present disclosure, the resistive memory elements 180 of the present disclosure can be formed by the first electrode 30 between insulating material portions of at least one insulating layer (88 or 60) over a substrate 6. A material layer stack (i.e., the resistive memory layer stack 80) including the carbon barrier material portion 82 and the resistive memory material portion 86 is formed over the second electrode 90 and the at least one insulating layer (88 or 60). A second conductive material can be deposited to form the second electrode 90 over the material layer stack 80. The resistive material element 180 can be a BMC memory cell of a ReRAM device.

In one embodiment, the resistive memory material portion 86 comprises a metal oxide material that changes resistivity upon application of an electric field with hysteresis in resistivity. In the barrier modulated cell (BMC) the electrically conductive metal oxide resistivity is switched by at least one of oxygen ion and/or oxygen vacancy diffusion in response to an application of an electric field thereto.

In one embodiment, the material layer stack 80 can be formed by depositing a carbon barrier layer including the carbon barrier material portion 82 over the first electrode 30, depositing a first interfacial metal oxide layer 85 on the carbon barrier layer, depositing a resistive memory material layer including the resistive memory material portion 86 over the first interfacial metal oxide layer 85, and depositing a second interfacial metal oxide layer 87 over the resistive memory material layer. In another embodiment, the order of deposition of layers (82, 85, 86 and 87) is reversed.

In one embodiment, an amorphous semiconductor material portion 81 can be deposited over the first electrode 30. The amorphous semiconductor material portion 81 can include a material selected from amorphous silicon, amorphous germanium, and an amorphous silicon-germanium alloy (e.g., an amorphous silicon layer). The carbon barrier layer can be deposited directly on the amorphous semiconductor material portion 81. Alternatively, the order of deposition of these layers can be reversed. Thus, the amorphous semiconductor (e.g., silicon) material portion 81 is deposited between the first electrode 30 and the carbon barrier material portion 82.

In one embodiment, a first electrically conductive line 30 embedded in a first insulating layer 38 can be formed over a substrate 6. A conductive via structure 230 can be formed on a top surface of the first electrically conductive line 30. A second insulating layer 88 laterally surrounds the conductive via structure 130, and the material layer stack 80 is formed on a top surface of the conductive via structure 230 and on a top surface of the second insulating layer 88 as illustrated in FIGS. 2A and 3A.

In one embodiment, a vertical stack including a first insulating layer 60, the first electrode 30 (as embodied as a first electrically conductive line 30), and a second insulating layer 60 can be formed over a substrate 6. The vertical stack (60, 30, 60) can be patterned to provide sidewalls of the first insulating layer 60, the first electrode portion 30, and the second insulating layer 60. The material layer stack 80 can be formed directly on the sidewalls of first insulating layer 60, the first electrode 30, and the second insulating layer 60.

The various embodiments of the present disclosure can provide superior resistive memory cells providing enhanced hysteresis in resistivity through use of a carbon barrier material portion 82. The carbon barrier material portion 82 can be incorporated into various configurations for the resistive memory device, which may be provided as a three-dimensional memory array device. The signal-to-noise ratio, the sense margin, the ratio of the on read current to off read current, increased read current and program voltage be enhanced through use of the carbon barrier material portions 82, whose property can be optimized by selection of the deposition temperature, the post deposition anneal temperature, and presence or absence of the amorphous semiconductor portion 81. The resistive memory cells, such as BMCs, can be used in a storage class memory (SCM) system.

Figure 12A:
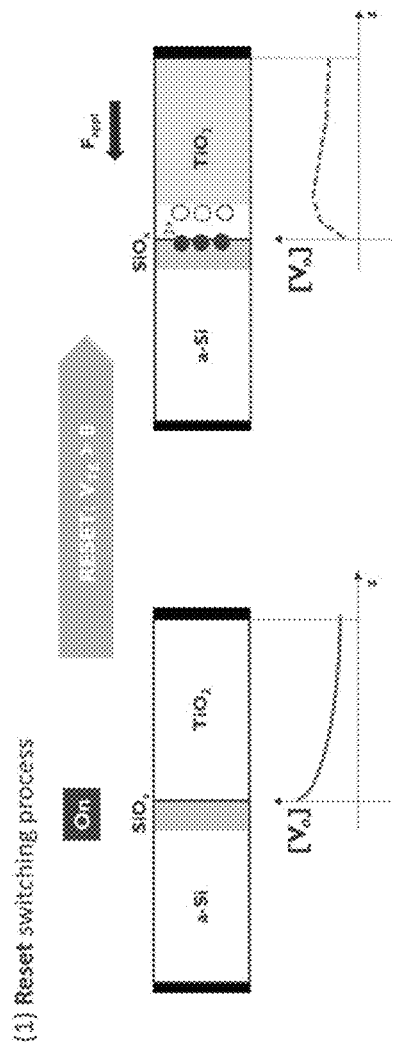
FIG. 12A is diagram illustrating operation of a prior art barrier modulated cell (BMC) ReRAM device during a reset switching process.
Figure 12B:
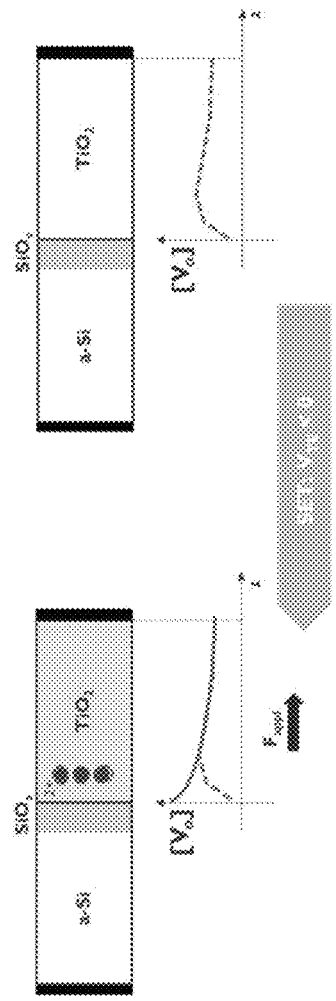
FIG. 12B is a diagram illustrating operation of a prior art BMC ReRAM device during a set switching process.
Figure 13A:
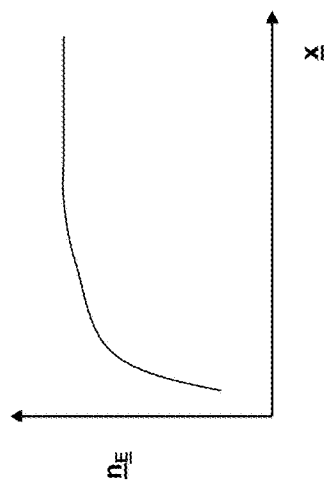
FIGS. 13A, 13B, 13C and 13D are schematic illustrations of operating conditions of a BMC ReRAM device according to an embodiment of the present disclosure.
Figure 13B:
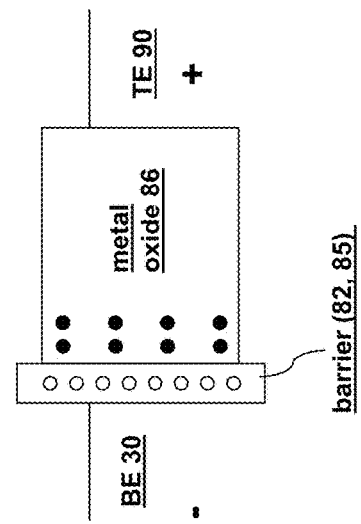
Figure 13C:
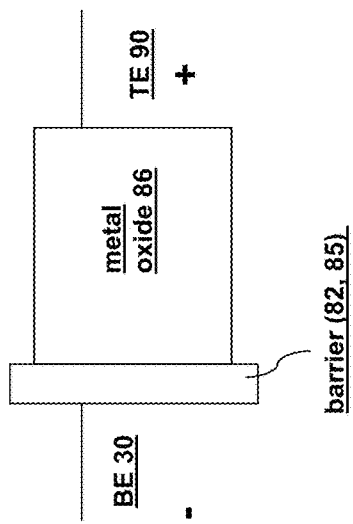
Figure 13D:
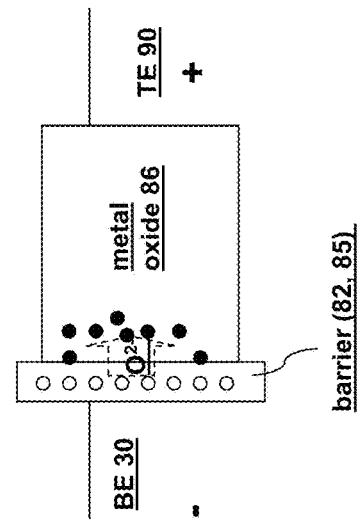

Without wishing to be bound by a particular theory, it is believed that a prior art BMC ReRAM device operates based on the principle shown in FIGS. 12A and 12B. FIG. 12A illustrates operation of the prior art BMC ReRAM device during a reset switching process. The switching mechanism in BMC stack is generally understood as oxygen interstitials Oi generation in the barrier oxide ($SiO_2$) at the amorphous silicon (a-Si)/$TiO_2$ interface during a RESET operation (i.e., resetting the stack into the high resistivity state, HRS), and drift into defect rich $TiO_x$ where they cause a re-oxidation of the $TiO_x$ near the interface. This re-oxidation decreases the conductivity of the $TiO_x$ layer and hence increases the resistance of the BMC stack and the cell is switched into the HRS state. Referring to FIG. 12B, operation of the prior BMC ReRAM device during a set switching process is illustrated. During the SET operation, opposite voltage is applied across the stack, and Ti—O bonds are supposed to be broken down to generate Oi and Vo pair. Oi will drift back to the a-Si/$TiO_x$ interface along the electric field to set the stack into the low resistivity state, LRS).

Without wishing to be bound by a particular theory, it is believed that a BMC ReRAM device of the embodiments of the present disclosure may operate based on the principle shown in FIGS. 12A and 12B and/or based on an alternative principle instead of or in addition to the principle shown in FIGS. 12A and 12B.

Without wishing to be bound by a particular theory, FIGS. 13A-13D and 14A-14B illustrate one alternative principle operation of the BMC ReRAM device of the embodiments of the present disclosure. The device can be switched between at least by different resistance states by oxygen-ion migration, which may be caused by a change in electron density. As the change in electron density (initiated by applying a voltage to the top and bottom electrodes (30, 90) is uniform across the surface, the migration of oxygen ions is uniform, and the effect scales with the area of the cell.

When an electric field is applied with a positive bias at the top electrode 90, the Schottky-barrier embodied by the carbon barrier material portion 82 represents a barrier for electrons. This causes a reduction of the electron density within the conductive metal oxide 86. The reduction of the electron density permits oxygen ions to migrate into the conductive metal oxide 86. This increases the barrier width (not height). When this process is finished, the cell is in the OFF-state (i.e., the HRS).

FIGS. 14A-14D illustrate a RESET operation into the OFF-state. FIG. 14A illustrates the electronic structure of the cell. The conductive metal oxide contains mobile electrons. The barrier, which comprises the carbon barrier 82 and/or the first interfacial metal oxide 85 (e.g., electrically insulating metal oxide) is in thermodynamic equilibrium with the conductive metal oxide 86 after deposition.

Referring to FIG. 14B, as a bias is applied, the electrons in the conductive metal oxide 86 are depleted near the barrier interface as the Schottky barrier at the bottom electrode 30 hems the flow of electrons through the barrier (82 and/or 85).

Referring to FIG. 14C, the field in the barrier oxide allows Frenkel pairs to emerge (i.e., oxygen interstitials and vacancies, Oi+Vo). The oxygen ions can migrate towards the conductive metal oxide 86 and due to the electron density reduction allows the oxygen ions to migrate as a consequence of the high electric field at the interface between the barrier and the conductive metal oxide into the conductive metal oxide. The oxygen ions can fill vacancies in the conductive metal oxide 86 or sit interstitially.

Referring to FIG. 14D, the oxygen vacancies in the barrier remain while the oxygen ions oxidize the conductive metal oxide 86. Overall, the change in electronic structure of the thin barrier is insignificant. However, the oxidation of the conductive metal oxide increases the potential drop across the barrier-metal oxide interface which represents a higher resistance state. This mechanism has self-limiting characteristics. As the electric field increases, the oxidation increases accordingly, and therefore, the voltage drop across the interface can be accommodated.

To set the cell back into the ON-state, the polarity of the applied voltage is reversed. This causes the oxygen ions to migrate into the opposite direction. This reduces the barrier width. This process is described in more detail in FIGS. 14A and 14B, which illustrate a SET operation into the ON-state.

Referring to FIG. 14A, the electronic structure of the cell in the SET-polarity allows for relatively easy electron transport as the barrier height of the conductive metal oxide/barrier interface is small. The drop of the field across the barrier causes the electron density to decrease near the conductive metal oxide interface a little bit. This enables oxygen ions to migrate back to the barrier. FIG. 14B illustrates electron density distribution during the SET-polarization.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A resistive memory device comprising at least one resistive memory element, wherein the at least one resistive memory element comprises;
a carbon barrier material portion; and
a layer stack that is disposed between a first electrode and a second electrode, wherein the layer stack comprises:
a first interfacial metal oxide layer;
a resistive memory material portion in direct contact with a surface of the first interfacial metal oxide layer; and
a second interfacial metal oxide layer in direct contact with a surface of the resistive memory material portion,
wherein the carbon barrier material portion directly contacts the first interfacial metal oxide layer,
wherein the carbon barrier material portion directly contacts the first electrode, and
wherein:
the first electrode comprises a pillar shaped conductive material portion that contacts a first electrically conductive line that extends along a first direction;
the second electrode comprises a portion of a second electrically conductive line that extends along a second direction that is different from the first direction; and
the carbon barrier material portion and the resistive memory material portion are located at a region in which the pillar shaped conductive material portion and the second electrically conductive line have a minimum spacing therebetween.

2. The resistive memory device of claim 1, wherein:
the at least one resistive memory element comprises a barrier modulated cell of a resistive random access memory (ReRAM) device; and
the resistive memory material portion comprises a metal oxide material having at least two states having different resistivity, which are switched by at least one of oxygen ion and oxygen vacancy diffusion in response to an application of an electric field to the metal oxide material.

3. The resistive memory device of claim 2, wherein the metal oxide material comprises sub-stoichiometric titanium oxide.

4. The resistive memory device of claim 1, wherein:
the first interfacial metal oxide layer comprises a first aluminum oxide layer having a thickness in a range from 0.3 nm to 1.0 nm; and
the second interfacial metal oxide layer comprises a second aluminum oxide layer having a thickness in a range from 0.3 nm to 1.0 nm.

5. The resistive memory device of claim 1, further comprising an amorphous silicon material portion disposed between the first electrode and the carbon barrier material portion.

6. The resistive memory device of claim 1, wherein:
the carbon barrier material portion has a thickness in a range from 2 nm to 10 nm;
the carbon barrier material portion contains less than 5 volume percent crystalline phase; and
the carbon barrier material portion comprises carbon and 14 to 60 atomic percent hydrogen.

7. The resistive memory device of claim 1, wherein:
the first electrode is located between insulating material portions of at least one insulating layer; and
the carbon barrier material portion directly contacts the at least one insulating layer.

8. The resistive memory device of claim 1, wherein the first electrode and the second electrode extend along two directions that are perpendicular to each other.

9. The resistive memory device of claim 8, wherein the at least one resistive memory element comprises a two-dimensional array of resistive memory elements located over a substrate.

10. The resistive memory device of claim 8, wherein the at least one resistive memory element comprises a three-dimensional array of resistive memory elements located over a substrate.

* * * * *